United States Patent
Watanabe et al.

(10) Patent No.: US 6,831,728 B2
(45) Date of Patent: Dec. 14, 2004

(54) METHOD OF MANUFACTURING NONLINEAR ELEMENT, METHOD OF MANUFACTURING ELECTROOPTIC DEVICE, ELECTROOPTIC DEVICE, AND ELECTRONIC APPARATUS

(75) Inventors: Yoshihiro Watanabe, Nagano-ken (JP); Takumi Seki, Misato-mura (JP); Hideaki Naono, Misato-mura (JP); Satoshi Taguchi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 44 days.

(21) Appl. No.: 10/115,005

(22) Filed: Apr. 4, 2002

(65) Prior Publication Data

US 2002/0145684 A1 Oct. 10, 2002

(30) Foreign Application Priority Data

Apr. 10, 1910 (JP) ...................................... 2001-111807
Apr. 4, 2001 (JP) ...................................... 2001-106279
Mar. 14, 2002 (JP) ...................................... 2002-070958

(51) Int. Cl.$^7$ ........................................... G02F 1/1365
(52) U.S. Cl. ............................ 349/187; 349/51; 349/52
(58) Field of Search ............................ 349/49, 51, 52, 349/187, 50; 257/410, 411, 30; 205/188, 189, 224, 229; 427/377, 404, 419.2; 438/30

(56) References Cited

U.S. PATENT DOCUMENTS 5,322,807 A * 6/1994 Chen et al. ................. 438/166
5,867,234 A * 2/1999 Takano et al. ................ 349/52
2001/0028057 A1 * 10/2001 Tanaka et al. ................ 257/59

FOREIGN PATENT DOCUMENTS

| JP | 07-311393 | 11/1995 |
|----|-----------|---------|
| JP | WO 96/23246 | 8/1996 |
| JP | WO 96/30953 | 10/1996 |
| JP | 10-247754 | 9/1998 |
| JP | 11-233852 | 8/1999 |
| KR | 1996-0026481 A | 7/1996 |
| KR | 10-0234407 B | 9/1999 |
| WO | WO 94-18600 A | 8/1994 |

* cited by examiner

Primary Examiner—Toan Ton
Assistant Examiner—Tai Duong

(57) ABSTRACT

The present invention provides a method of manufacturing a nonlinear element capable further improving nonlinearity of a nonlinear element, an electrooptic device, and electronic apparatus. In forming an element substrate of a liquid crystal device, an underlying layer is formed on the surface of the element substrate in the underlying layer forming step (a), and then a first metal film having a metal film containing at least Ta is formed in the first metal film forming step (b). Then, in the insulating film forming step (c), the first metal film is annealed under high pressure in an atmosphere containing water vapor to form an insulating film on the first metal film. Then, in the second metal film forming step, a second metal film is formed on the surface of the insulating film film to produce a nonlinear element.

19 Claims, 19 Drawing Sheets

[FIG. 1]
(a)
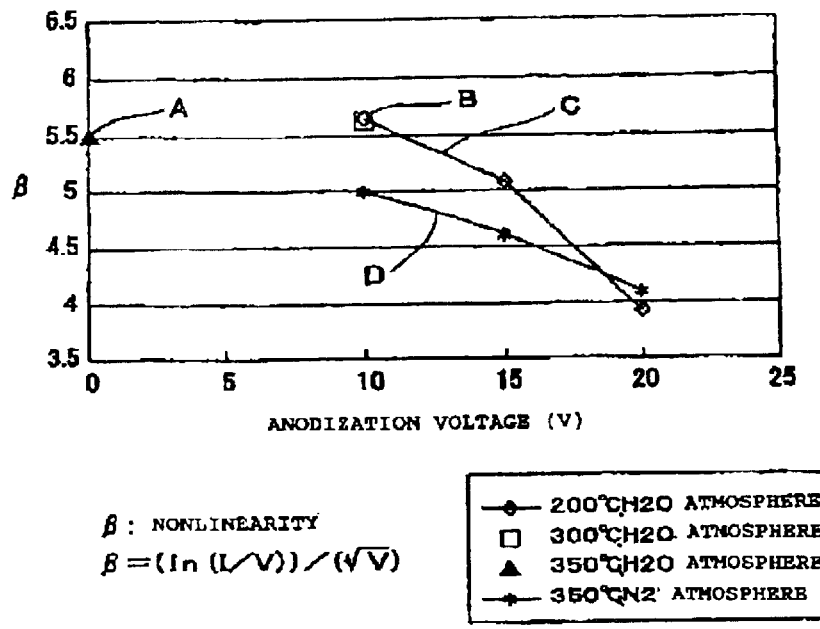
$\beta$ : NONLINEARITY
$\beta = (\ln(I/V))/(\sqrt{V})$
(b)
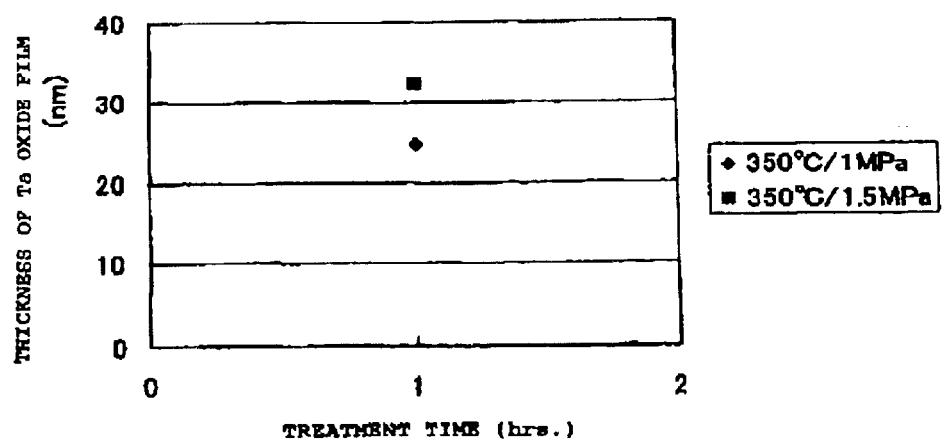

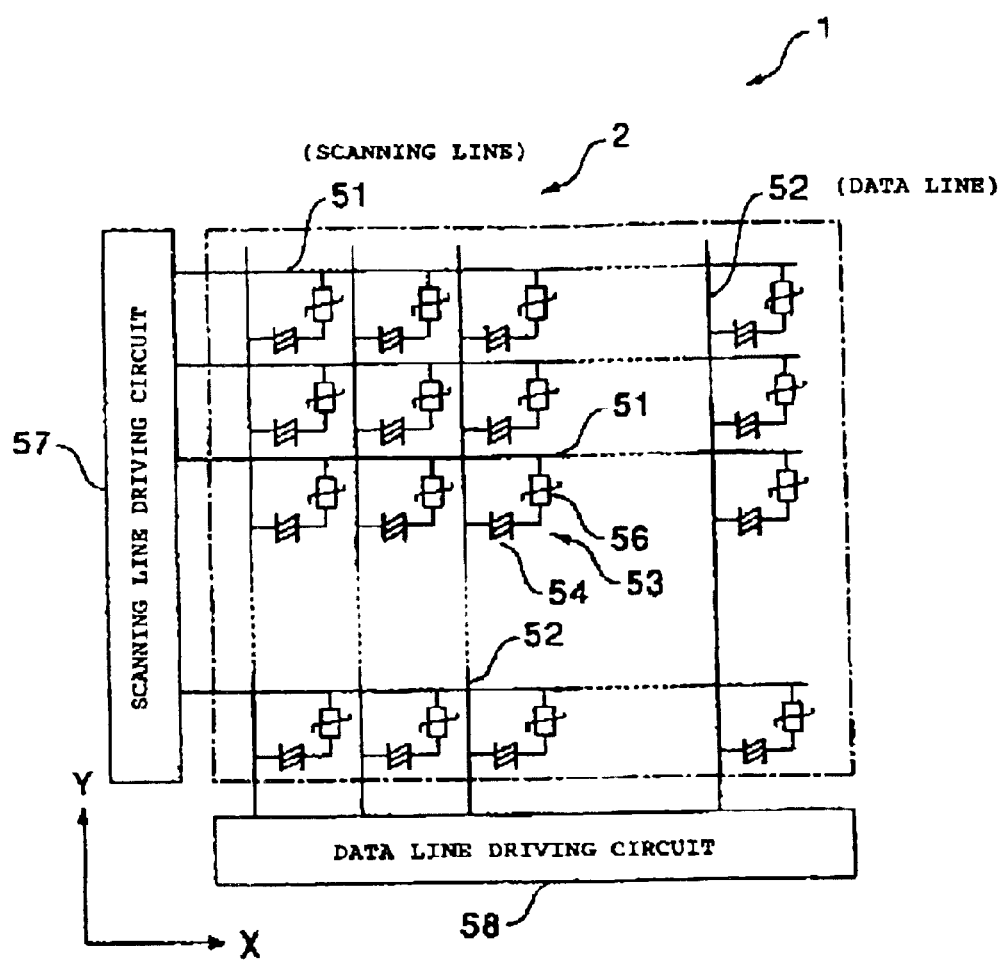

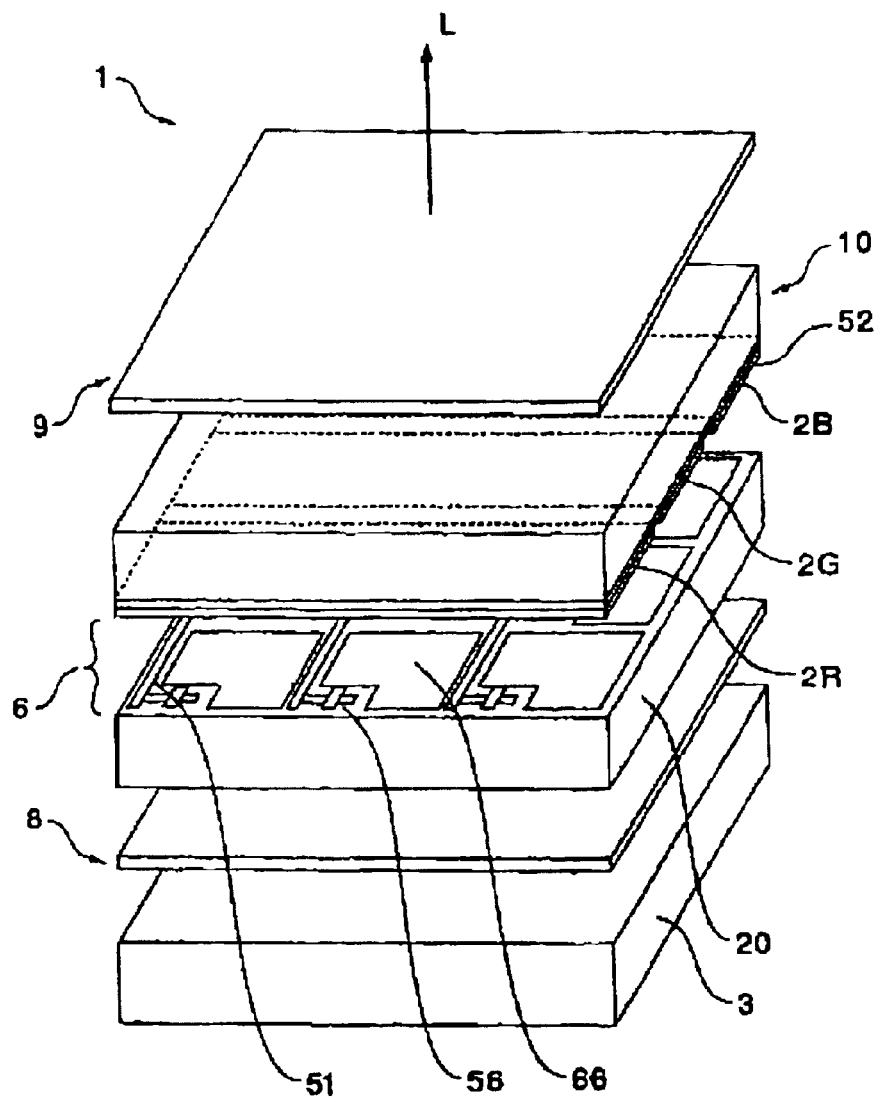
[FIG. 3]

[FIG. 4]
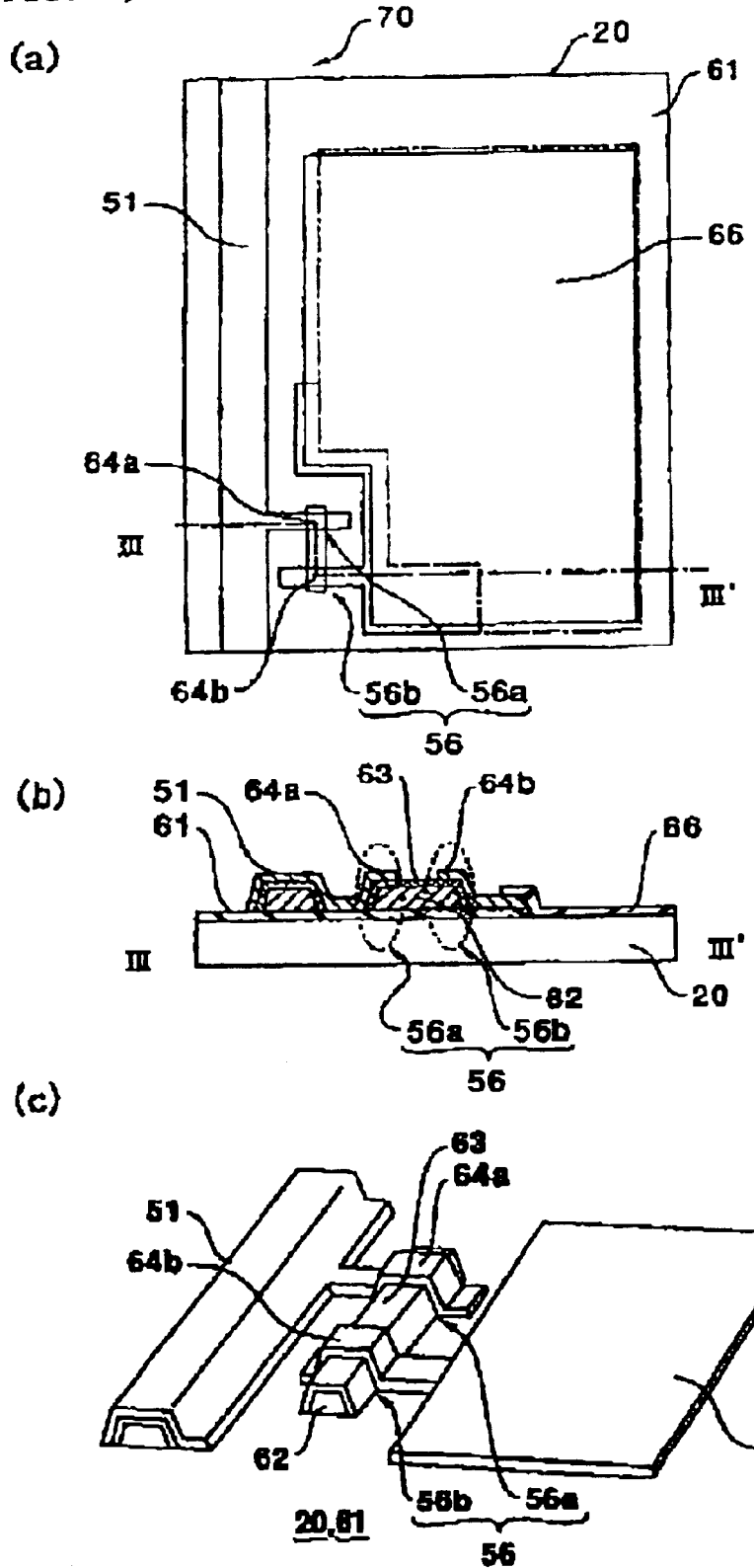

[FIG. 5]
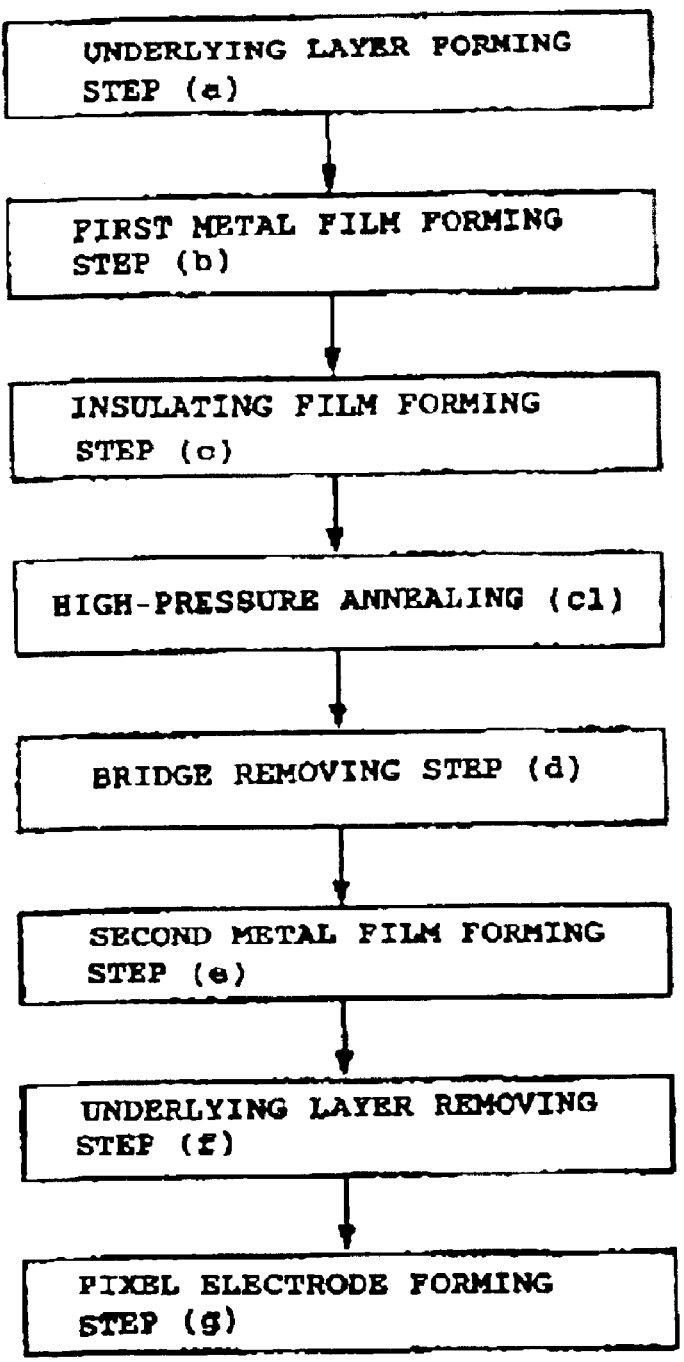

[FIG. 6]
(a) FORMATION OF UNDERLYING LAYER
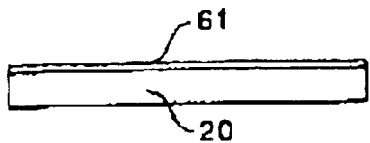
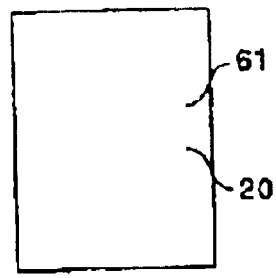
(b) FORMATION OF FIRST METAL FILM
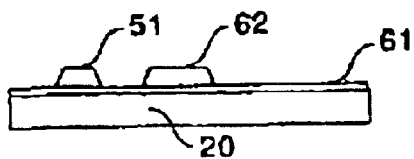
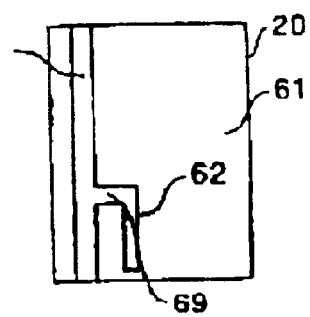
(c) FORMATION OF INSULATING FILM
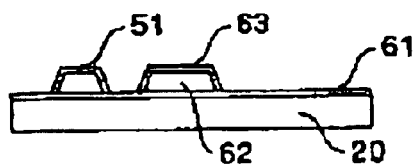
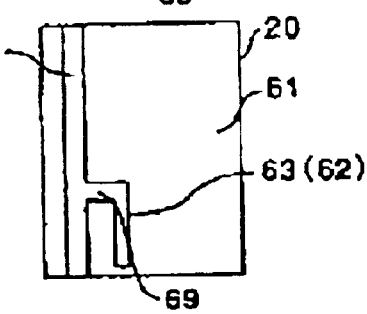
(c') HIGH-PRESSURE ANNEALING
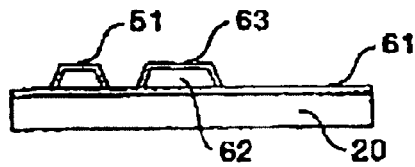
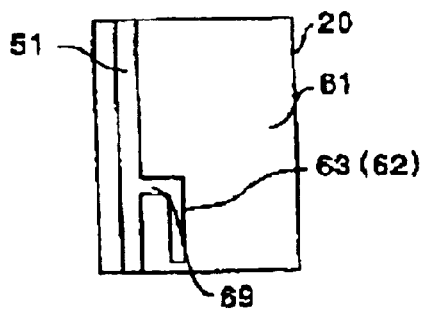
(d) REMOVAL OF BRIDGE
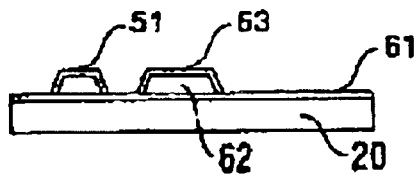
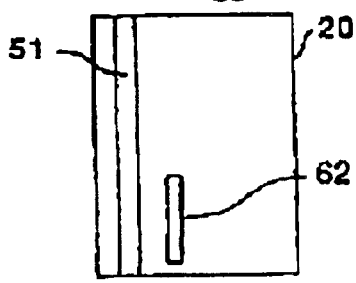

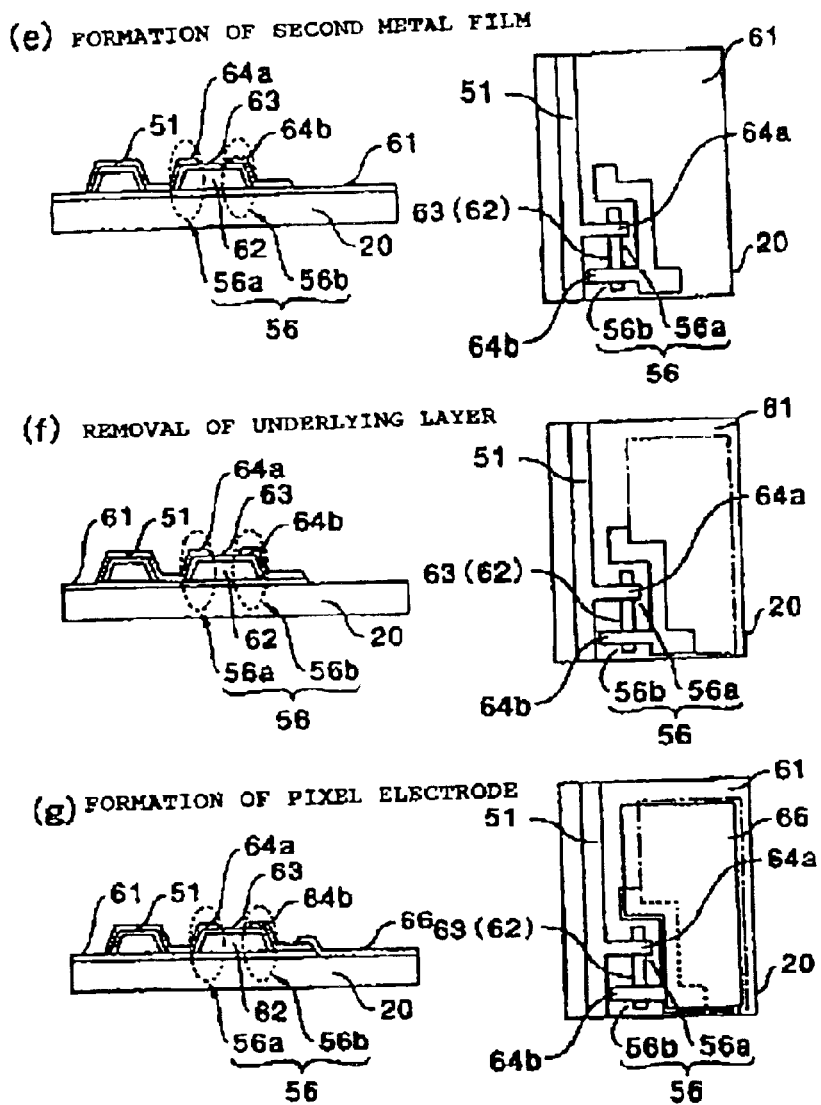
[FIG. 7]
(e) FORMATION OF SECOND METAL FILM
(f) REMOVAL OF UNDERLYING LAYER
(g) FORMATION OF PIXEL ELECTRODE

[FIG. 8]
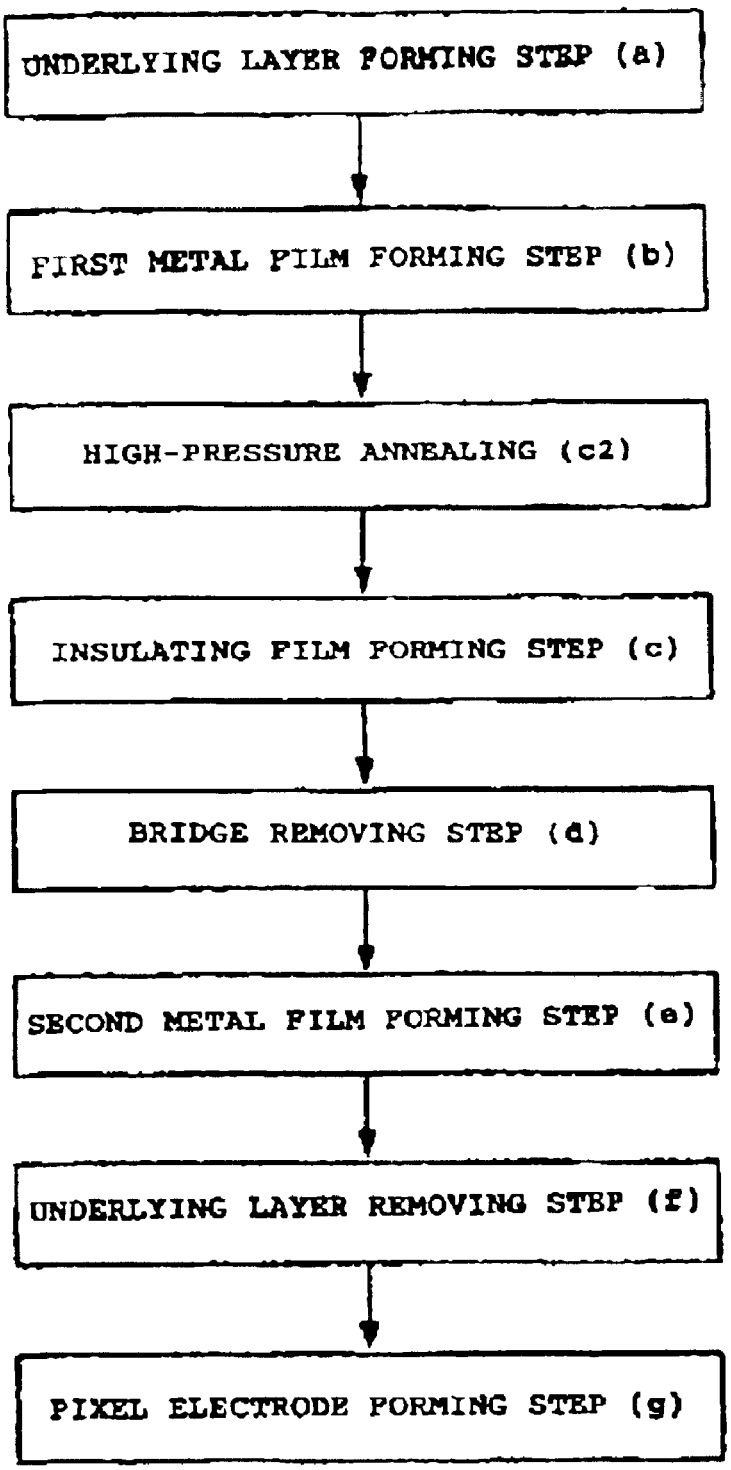

[FIG. 9]
(a) FORMATION OF UNDERLYING LAYER
(b) FORMATION OF FIRST METAL FILM
(c2) HIGH-PRESSURE ANNEALING
(c) FORMATION OF INSULATING FILM
(d) REMOVAL OF BRIDGE
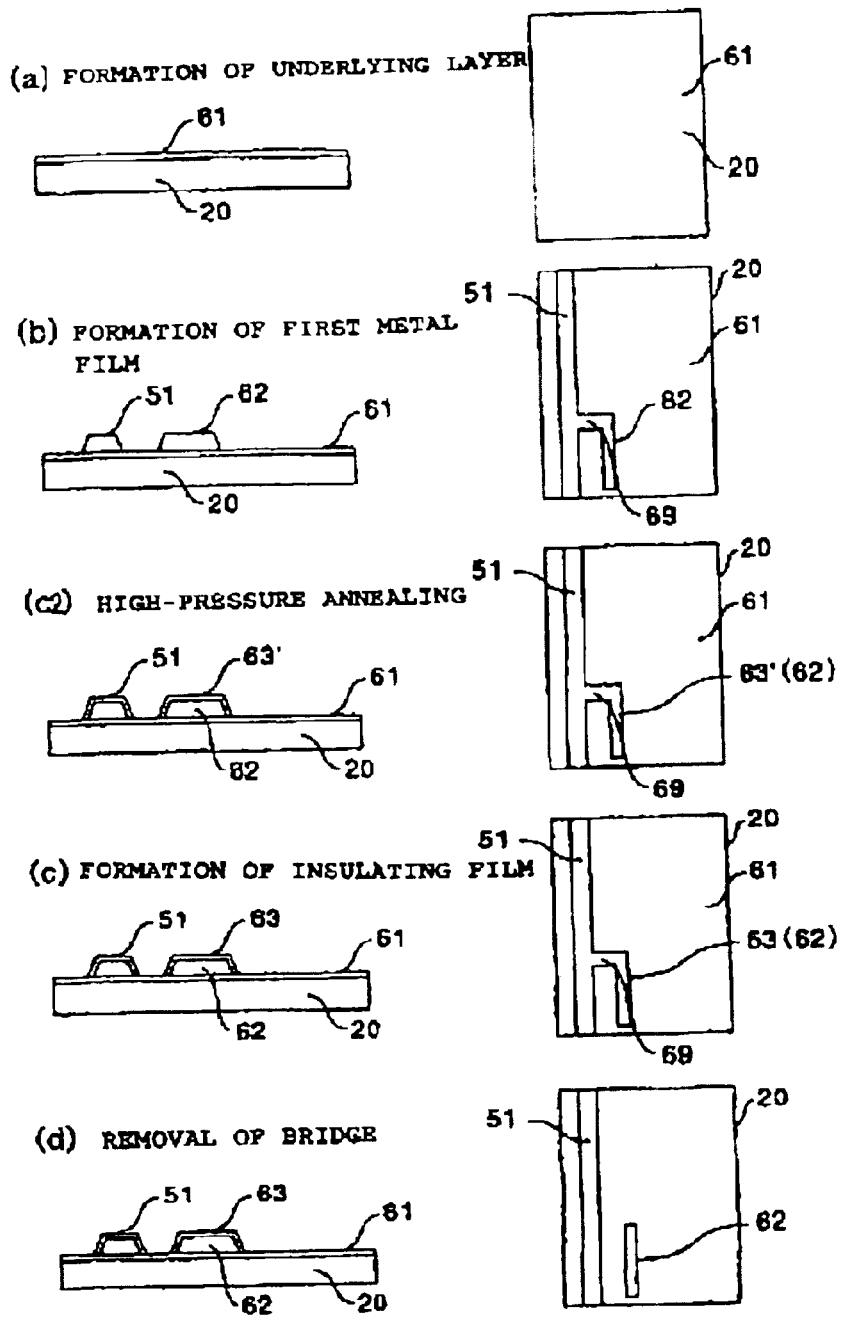

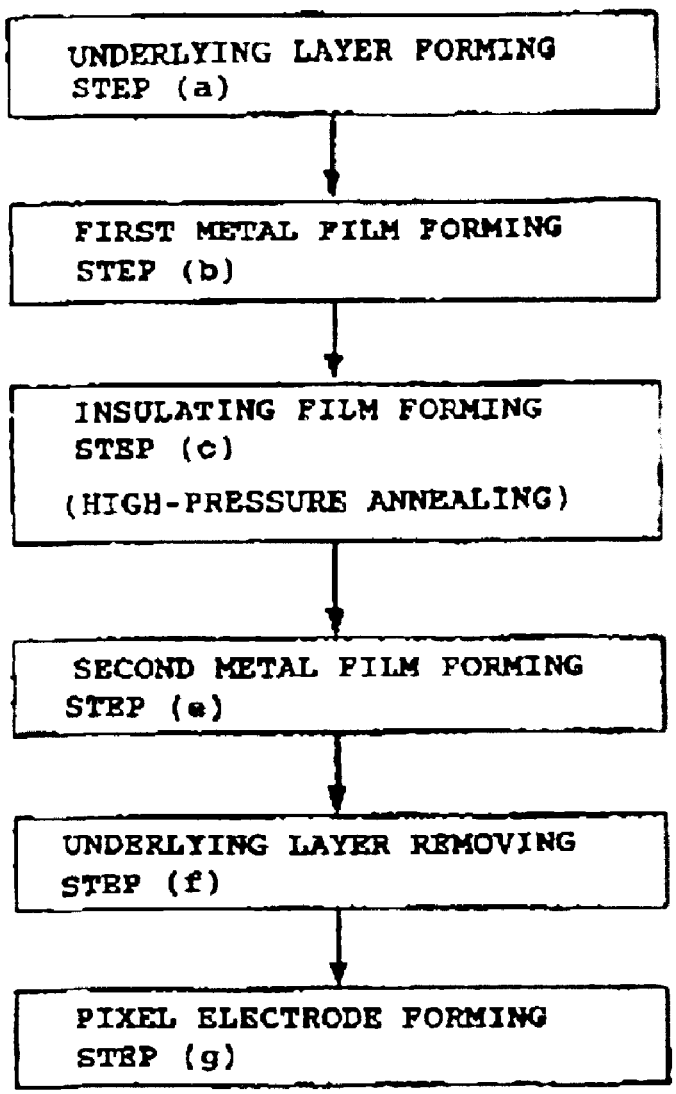
[FIG. 10]

[FIG. 11]
(a) FORMATION OF UNDERLYING LAYER
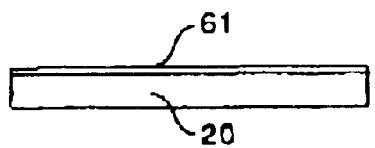 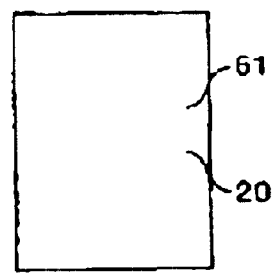
(b) FORMATION OF FIRST METAL FILM
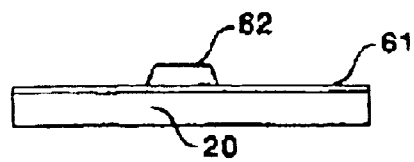 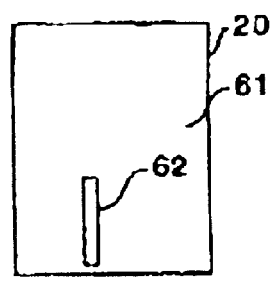
(c) FORMATION OF INSULATING FILM (HIGH-PRESSURE ANNEALING)
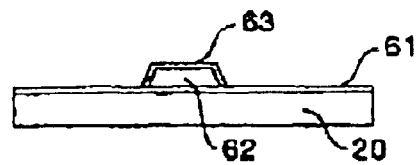 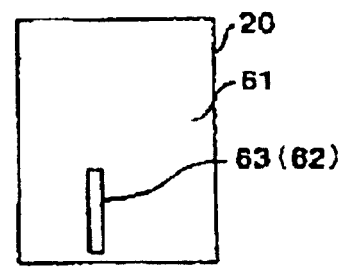

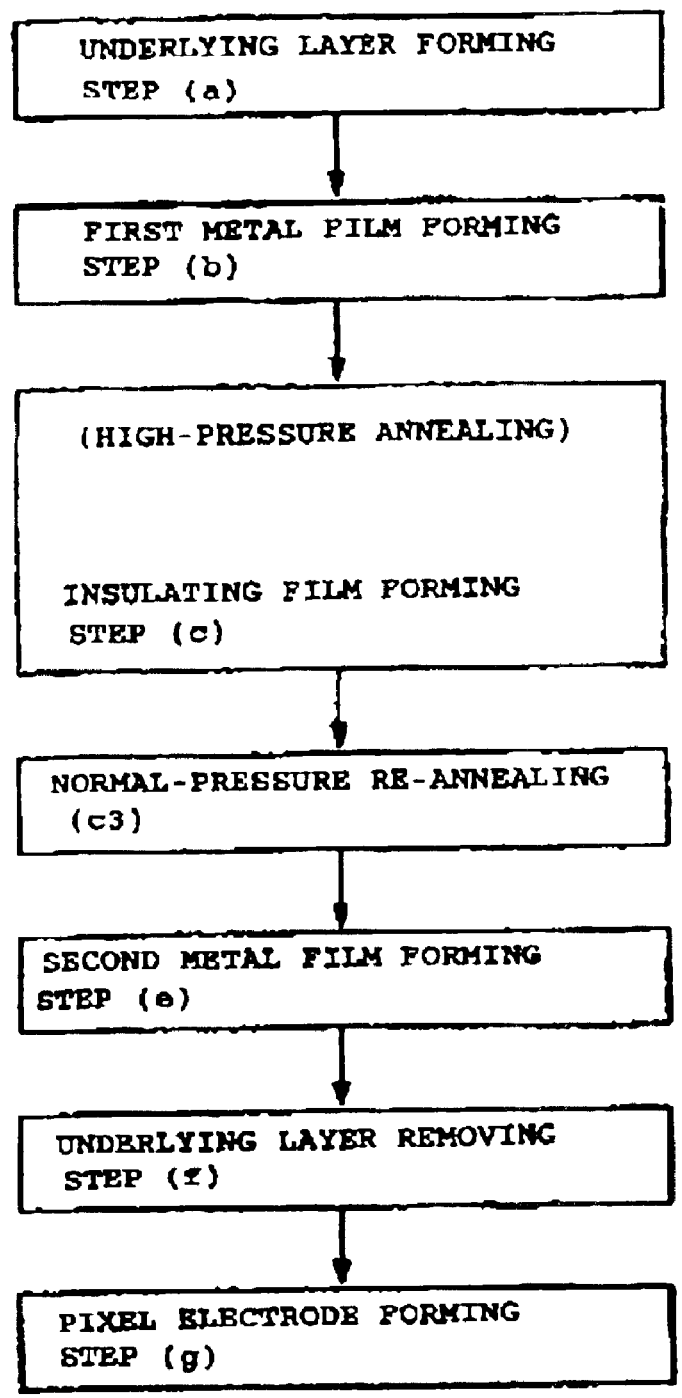
[FIG. 12]

[FIG. 13]
(a) FORMATION OF UNDERLYING LAYER
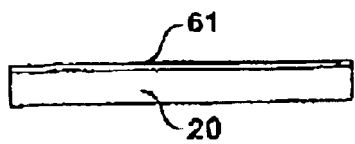
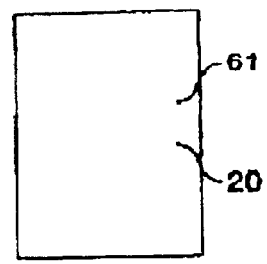
(b) FORMATION OF FIRST METAL FILM
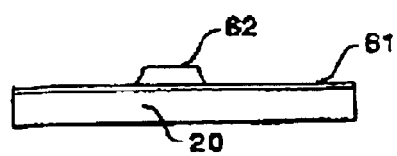
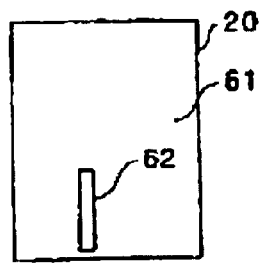
(c) FORMATION OF INSULATING FILM (HIGH-PRESSURE ANNEALING)
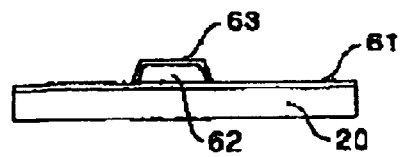
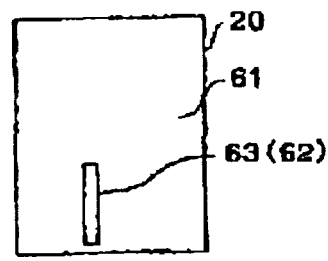
(c') RE-ANNEALING UNDER NORMAL PRESSURE

[FIG. 14]
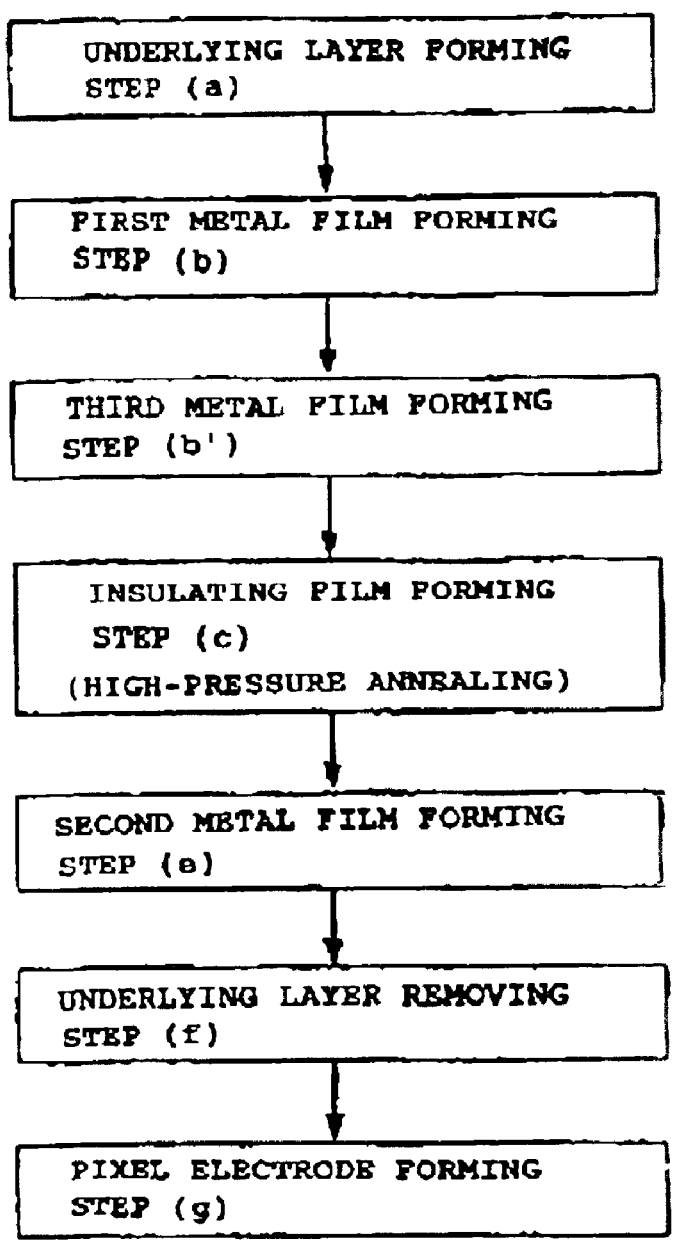

[FIG. 15]
(a) FORMATION OF UNDERLYING LAYER
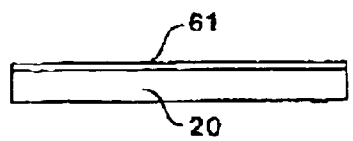
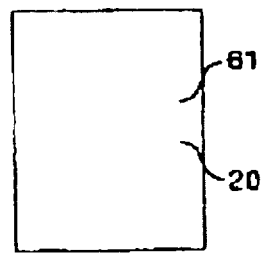
(b) FORMATION OF FIRST METAL FILM
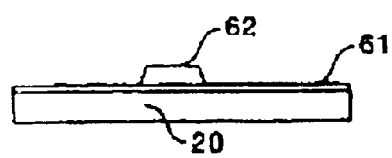
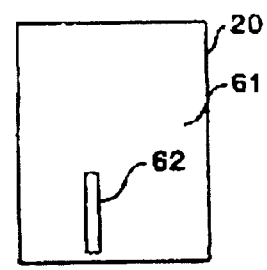
(b') FORMATION OF THIRD METAL FILM
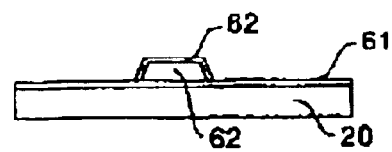
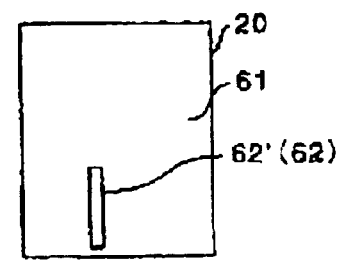
(c) FORMATION OF INSULATING FILM (HIGH-PRESSURE ANNEALING)
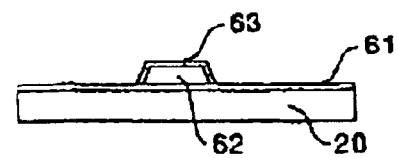
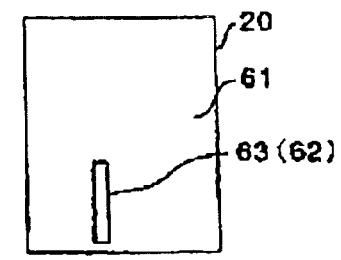

[FIG. 16]
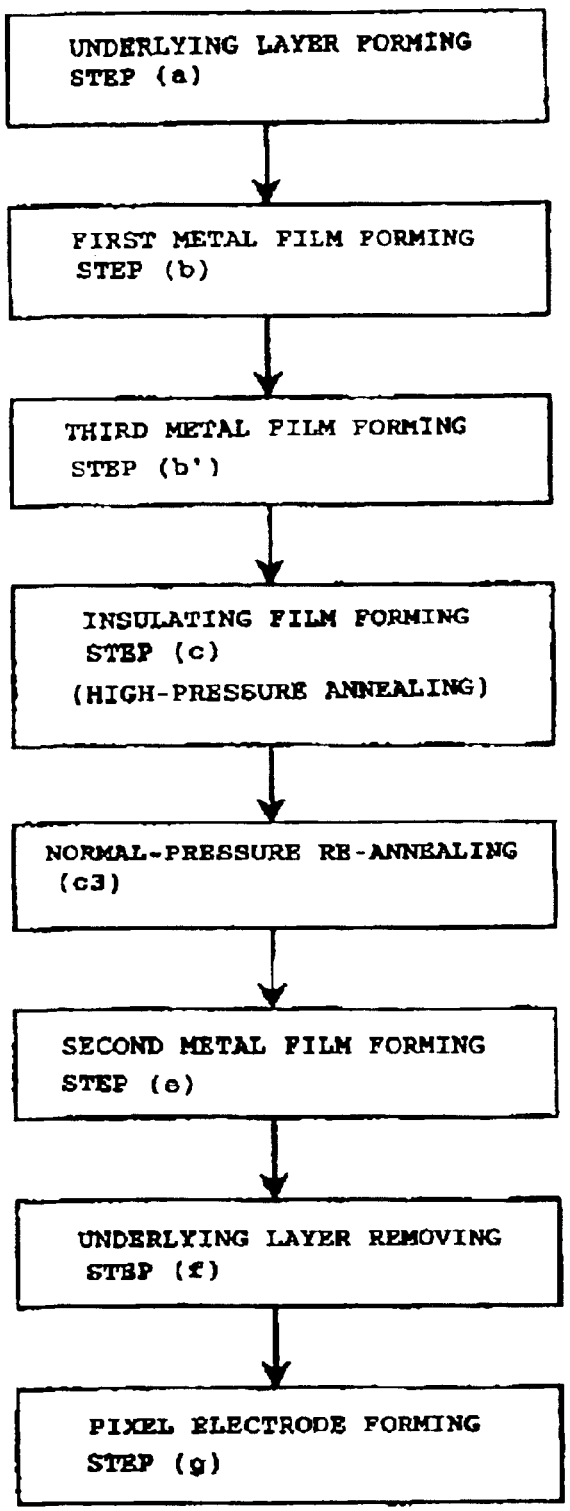

[FIG. 17]
(a) FORMATION OF UNDERLYING LAYER
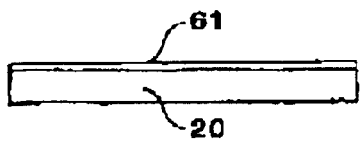
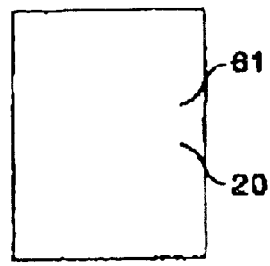
(b) FORMATION OF FIRST METAL FILM
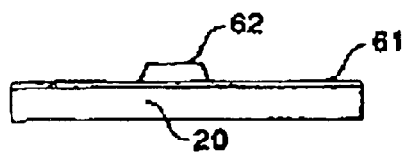
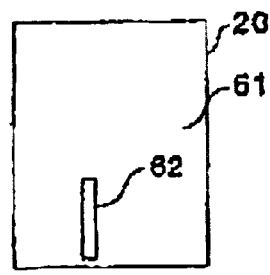
(b') FORMATION OF THIRD METAL FILM
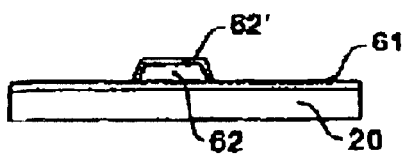
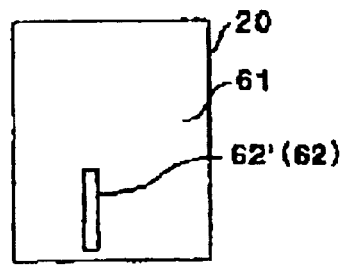
(c) FORMATION OF INSULATING FILM (HIGH-PRESSURE ANNEALING)
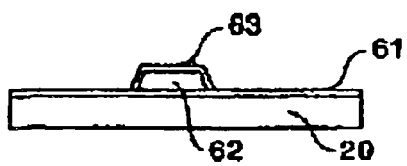
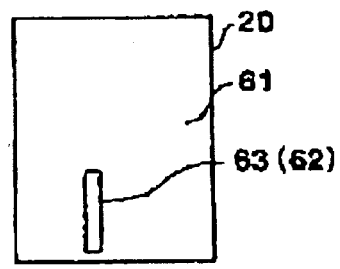
(c3) RE-ANNEALING UNDER NORMAL PRESSURE

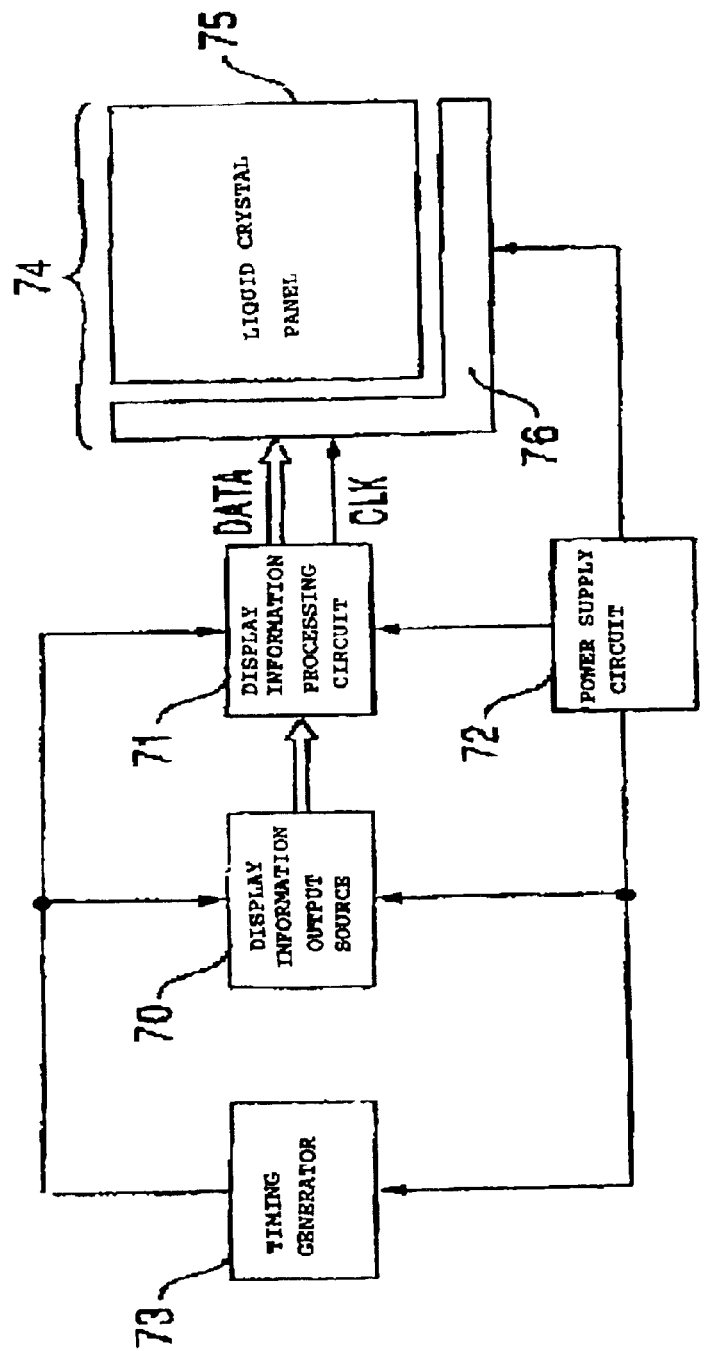
[FIG. 18]

[FIG. 19]
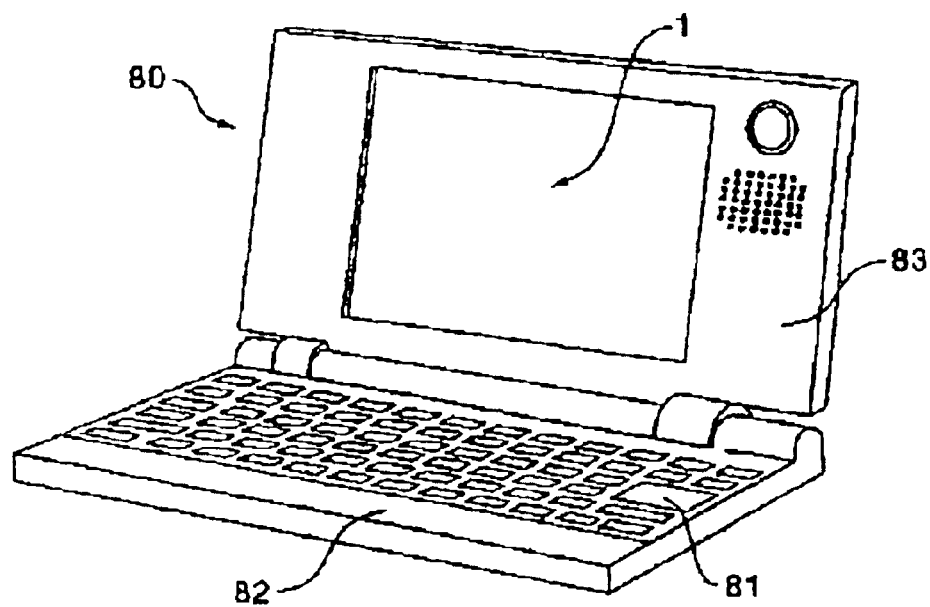
[FIG. 20]
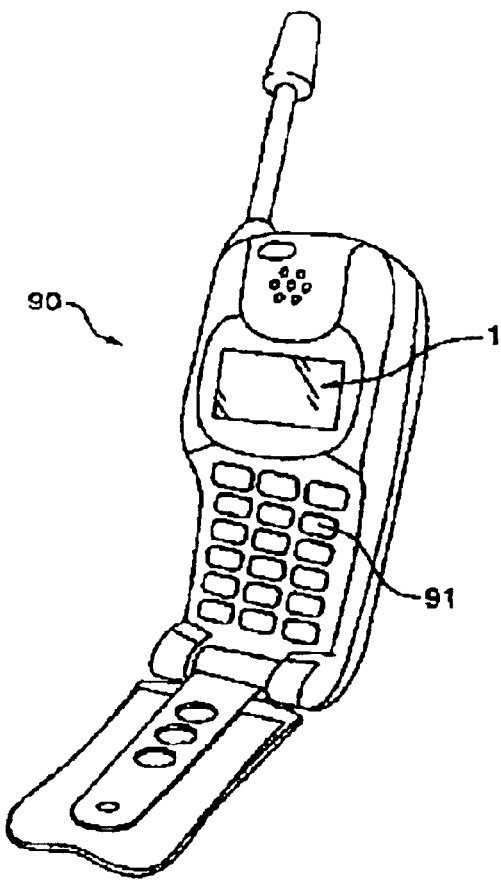

METHOD OF MANUFACTURING NONLINEAR ELEMENT, METHOD OF MANUFACTURING ELECTROOPTIC DEVICE, ELECTROOPTIC DEVICE, AND ELECTRONIC APPARATUS

BACKGROUND OF THE INVENTION

1. Field of Invention

The present invention relates to a method of manufacturing a nonlinear element, a method of manufacturing an electrooptic device, an electrooptic device, and an electronic apparatus. More specifically, the present invention relates to a technique for forming an insulating film which constitutes a nonlinear element.

2. Description of Related Art

Electrooptic devices, such as a liquid crystal device and an EL (electroluminescence) display panel, have been recently popularized as display sections of electronic apparatuses, such as a cell phone, a portable computer, a video camera, etc.

A known example of liquid crystal devices among such electrooptic devices uses a thin film diode (TFD) element as a pixel switching nonlinear element for active matrix driving.

Such a liquid crystal device can include a pair of substrates which hold a liquid crystal therebetween, TFD elements and pixel electrodes formed on one of the substrates, and stripe-shaped counter electrodes (signal electrodes) formed on the other substrate. Each of the TFD elements is formed by, for example, forming a first metal film such as a Ta film or a Ta alloy film on the surface of the substrate, forming an insulating film on the surface of the first metal film by anodization, and then forming a second metal film on the surface of the insulating film.

SUMMARY OF THE INVENTION

In a liquid crystal device using the TFD elements as nonlinear elements, when the current-voltage characteristics of the TFD elements have high nonlinearity, the driving voltage of the liquid crystal device can be set to a low value, and a high-contrast display can be realized. Based on this view, a method of annealing an insulating film in a water vapor atmosphere to modify the insulating film has been studied as a technique for improving the characteristics of the TFD elements, as disclosed in, for example, Japanese Unexamined Patent Publication No. 08-830953. However, further improvement is required.

In order to suppress the difference (polar difference) in quantity between the currents flowing through a TFD element with the positive and negative applied voltages, a back-to-back structure is generally used, in which two TFD elements are connected in series. In the back-to-back structure, the step of depositing an insulating film by anodization requires power feed to an element portion, and thus anodization must be effected in a state in which a portion constituting a TFD element is connected to wiring for passing an anodization current through a bridge portion. Therefore, after the insulating film is formed by anodization, the bridge portion for connecting the TFD element portion and the feed wiring for anodization must be cut, thereby causing the problem of increasing the number of manufacturing steps.

In consideration of the above problem, an object of the present invention is to provide a method of manufacturing a nonlinear element capable of further improving electrical properties, such as nonlinearity of a TFD element, a method of manufacturing an electrooptic device, an electrooptic device, and an electronic apparatus.

Another object of the present invention is to provide a method of manufacturing a nonlinear element capable of decreasing the number of steps for manufacturing a nonlinear element to permit the manufacture of a nonlinear element at low cost.

In order to achieve the objects of the present invention, a method of manufacturing a nonlinear element having a first metal film, an insulating film, and a second metal film, which are laminated in this order, can include the first metal film forming step of forming the first metal film, the second metal film forming step of forming the second metal film, and the high-pressure annealing step of performing annealing in a predetermined atmosphere under a high pressure between the first metal film forming step and the second metal film forming step.

In the present invention, in order to modify the insulating film formed by anodization, high-pressure annealing is performed in an inert gas atmosphere, a nitrogen gas atmosphere or an atmosphere containing water vapor. In order to oxidize the surface of a metal film, high-pressure annealing is performed in an atmosphere containing water vapor. In this way, high-pressure annealing in a predetermined atmosphere can further improve the nonlinearity of the current-voltage characteristics of a nonlinear element, as compared with normal-pressure annealing in a water vapor atmosphere. Therefore, in a liquid crystal device, the driving voltage can be set to a low value, and a display of high quality such as improved contrast or the like can be realized.

In the present invention, the first metal film can include, for example, a metal film containing at least Ta.

For example, the present invention may include the first metal film forming step, an insulating film forming step of forming the insulating film on the surface of the first metal film by anodization, the high-pressure annealing step of performing annealing in an inert gas atmosphere, a nitrogen gas atmosphere or an atmosphere containing water vapor, and the second metal film forming step for forming the second metal film on the surface of the insulating film. In this case, high-pressure annealing is performed, for example, under the conditions including a temperature of 100° C. to 600° C., and a pressure of 0.5 MPa to 3 MPa, and preferably the conditions including a temperature of 150° C. to 300° C., and a pressure of 0.5 MPa to 2 MPa. In this construction, the insulating film formed by anodization can be modified to improve the nonlinearity of the current-voltage characteristics of a nonlinear element. Also, high-pressure annealing can obtain the same effect as conventional annealing at a lower annealing temperature than the conventional annealing, thereby preventing deformation of a substrate.

For example, in experiment for manufacturing a TFD element having the back-to-back structure, an anodic oxide film was formed on a Ta film by anodization with a voltage set to each of 10 V, 15 V and 20 V, and then high-pressure annealing for 1 hour at 200° C. in an atmosphere containing water vapor under a high pressure of 1 MPa, high-pressure annealing for 1 hour at 300° C. in an atmosphere containing water vapor under a high pressure of 1 MPa, and high-pressure annealing for 1 hour at 350° C. in a nitrogen atmosphere under a high pressure of 1 MPa were performed for studying nonlinearity β of a nonlinear element. As a result, the results shown by solid line C, point B and solid line D in FIG. 1(a) were obtained. As shown in FIG. 1 (a), good nonlinearity β can be obtained by high-pressure annealing. According to the experimental results shown in the graph, and other experimental results obtained, high-pressure annealing at a temperature of 200° C. and a pressure of about 1 MPa produces a nonlinear element having good nonlinearity β.

For example, the present invention can include the first metal film forming step, the high-pressure annealing step performing high-pressure annealing in an atmosphere containing water vapor to oxidize the surface of the first metal film, the insulating film forming step of forming the insulating film on the surface of the first metal film by anodizing the surface of the first metal film, and the second metal film forming step for forming the second metal film on the surface of the insulating film. In this case, high-pressure annealing is performed, for example, under the conditions including a temperature of 100° C. to 600° C. and a pressure of 0.5 MPa to 3 MPa, and preferably the conditions including a temperature of 150° C. to 300° C. and a pressure of 0.5 MPa to 2 MPa. In this construction, the insulating film formed by high-pressure annealing, and the insulating film formed by anodization can be used as the insulating film of the nonlinear element, thereby improving the nonlinearity of the current-voltage characteristics of the nonlinear element.

For example, the present invention can include the first metal film forming step, the high-pressure annealing step of oxidizing the surface of the first metal film by high-pressure annealing in an atmosphere containing water vapor to form the insulating film, and the second metal film forming step for forming the second metal film on the surface of the insulating film. In this construction, the insulating film formed by high-pressure annealing can be used as the insulating film of the nonlinear element, thereby improving the nonlinearity of the current-voltage characteristics of the nonlinear element. Furthermore, since the insulating film is formed by high-pressure annealing, anodization is not performed. Therefore, the TFD element having the back-to-back structure has no need to form a bridge portion for power feeding in anodization, and thus the step of removing the bridge portion can also be omitted.

For example, as a result of experiment, when anodization of the Ta film is not performed, i.e., when high-pressure annealing at 350° C. with an anodization voltage of 0 V is performed, a nonlinear element exhibiting a good nonlinearity β of about 5.5 is obtained, as shown by point A in FIG. 1 (a). According to the results of experiment, a nonlinear element having good nonlinearity β is obtained by high-pressure annealing at a temperature of 350° C. and a pressure of 1 MPa.

FIG. 1(b) shows the relationship between the high-pressure annealing condition and the thickness of a Ta oxide film formed by oxidizing the surface of a Ta film in high-pressure annealing. Under the condition shown in FIG. 1(b), the atmosphere contained 100% of water vapor. In treatment at a temperature of 350° C. and a pressure of 1 Ma for 1 hour, the Ta oxide film having a thickness of about 250 Å was deposited. While in treatment at a temperature of 350° C. and a pressure of 1.5 Ma for 1 hour, the Ta oxide film having a thickness of about 320 Å was deposited.

In the present invention, after the high-pressure annealing, re-annealing is preferably performed for annealing the insulating film under a lower pressure than that in the high-pressure annealing.

For example, the present invention preferably includes the first metal film forming step, the third metal film forming step of forming a third metal film on the surface of the first metal film, the step of oxidizing the surface of the third metal film by high-pressure annealing in an atmosphere containing water vapor to form the insulating film, and the second metal film forming step for forming the second metal film on the surface of the insulating film. In this case, the third metal film includes, for example, a metal film containing at least Ta. In this construction, the insulating film formed by high-pressure annealing can be used as the insulating film of the nonlinear element, thereby improving the nonlinearity of the current-voltage characteristics of the nonlinear element. Furthermore, since the insulating film is formed by high-pressure annealing, anodization is not performed. Therefore, the TFD element having the back-to-back structure has no need to form the bridge portion for power feeding in anodization, and thus the step of removing the bridge portion can also be omitted.

In the present invention, after the high-pressure annealing, re-annealing is preferably performed for annealing the insulating film under a lower pressure than that in the high-pressure annealing.

In the present invention, when the insulating film formed by high-pressure annealing is used as the insulating film of the nonlinear element, high-pressure annealing is performed under the conditions including a temperature of 250° C. to 400° C. and a pressure of 0.5 MPa to 3 MPa, and preferably the conditions including a temperature of 300° C. to 400° C. and a pressure of 0.5 MPa to 2 MPa. By annealing under such a high pressure, oxidation of the surface of the metal film is accelerated to obtain a uniform oxide film having good properties as the insulating film, as compared with annealing under a lower pressure (for example, under normal pressure). Therefore, in the TFD element including the insulating film formed by this method, the nonlinearity of the current-voltage characteristics can be further improved.

In the present invention, re-annealing is preferably performed before the second metal film forming step. Namely, it is preferred that after re-annealing is carried out, the second metal film is formed on the surface of the insulating film in the second metal film forming step.

In the present invention, re-annealing is preferably performed in an atmosphere containing water vapor or nitrogen to crystallize the insulating film. In this construction, the insulating film can be crystallized to improve the nonlinearity of the current-voltage characteristics of the nonlinear element.

In the present invention, re-annealing is preferably performed at a temperature of 100° C. to 500° C.

In accordance with the present invention, a method of manufacturing an electrooptic device comprising a substrate maintaining an electrooptic material can include forming a nonlinear element as a pixel switching element by the method of manufacturing a nonlinear element of the present invention, and forming a pixel electrode on the substrate so that the pixel electrode is connected to the nonlinear element.

An electrooptic device manufactured by the method of present invention can include a substrate maintaining an electrooptic material, a nonlinear element having a first metal film, an insulating film and a second metal film and provided as a pixel switching element on the surface of the substrate on which the electrooptic material is maintained, the insulating film being formed by annealing the first metal film.

In another aspect of present invention, an electrooptic device manufactured by the method of the present invention includes a substrate maintaining an electrooptic material, a nonlinear element having a first metal film, an insulating film and a second metal film and provided as a pixel switching element on the surface of the substrate on which the electrooptic material is maintained, the insulating film being formed by annealing a third metal film formed on the surface of the first metal film.

In the present invention, the electrooptic material is, for example, a liquid crystal.

In the present invention, the TFD element having good characteristics can be formed by a simple process, and thus the method of manufacturing an electrooptic device using the simple process is capable of manufacturing, by a simple process, an electrooptic device capable of realizing high contrast while keeping the driving voltage down.

An electrooptic device to which the present invention is applied can be used as the display sections of electronic apparatuses, such as a cell phone, a mobile computer, and the like.

BRIEF DESCRIPTION OF THE DRAWINGS

The present invention will be described with reference to the accompanying drawings wherein like numerals reference like elements, and wherein:

FIG. 1 (a) is a graph showing an example of the effect of high-pressure annealing preformed in a method of manufacturing a nonlinear element to which present invention was applied;

FIG. 1(b) is a graph showing an example of the effect of high-pressure annealing preformed in a method of manufacturing a nonlinear element to which present invention was applied;

FIG. 2 is a block diagram schematically showing the electrical configuration of a liquid crystal device to which the present invention is applied;

FIG. 3 is an exploded perspective view showing the structure of the liquid crystal device shown in FIG. 2;

FIGS. 4(a), (b) and (c) are respectively a plan view of one pixel in an element substrate of a pair of substrates which hold a liquid crystal therebetween in a liquid crystal, a sectional view taken along line III—III' in FIG. 4(a), and a perspective view of a TFD element formed in each pixel;

FIG. 5 is a drawing showing the steps of a method of manufacturing an element substrate of a liquid crystal device according to embodiment 1 of the present invention;

FIG. 6 is a sectional view showing the steps from the underlying layer forming step to the bridge removing step of the manufacturing steps shown in FIG. 5;

FIG. 7 is a sectional view showing the steps from the second metal film forming step to the pixel electrode forming step of the manufacturing steps shown in FIG. 5;

FIG. 8 is a drawing showing the steps of a method of manufacturing an element substrate of a liquid crystal device according to embodiment 2 of the present invention;

FIG. 9 is a sectional view showing the steps from the underlying layer forming step to the bridge removing step of the manufacturing steps shown in FIG. 8;

FIG. 10 is a drawing showing the steps of a method of manufacturing an element substrate of a liquid crystal device according to embodiment 3 of the present invention;

FIG. 11 is a sectional view showing the steps from the underlying layer forming step to the insulating film forming step of the manufacturing steps shown in FIG. 10;

FIG. 12 is a drawing showing the steps of a method of manufacturing an element substrate of a liquid crystal device according to embodiment 4 of the present invention;

FIG. 13 is a sectional view showing the steps from the underlying layer forming step to the normal-pressure re-annealing step of the manufacturing steps shown in FIG. 12;

FIG. 14 is a drawing showing the steps of a method of manufacturing an element substrate of a liquid crystal device according to embodiment 5 of the present invention;

FIG. 15 is a sectional view showing the steps from the underlying layer forming step to the insulating film forming step (high-pressure annealing step) of the manufacturing steps shown in FIG. 14;

FIG. 16 is a drawing showing the steps of a method of manufacturing an element substrate of a liquid crystal device according to embodiment 6 of the present invention;

FIG. 17 is a sectional view showing the steps from the underlying layer forming step to the normal-pressure re-annealing step of the manufacturing steps shown in FIG. 16;

FIG. 18 is a block diagram showing the configuration of an example of various electronic apparatuses using a liquid crystal device of the present invention;

FIG. 19 is a drawing illustrating a mobile personal computer as an electronic apparatus using a liquid crystal device of the present invention according to an embodiment of the present invention; and FIG. 20 is a drawing illustrating a cellular phone as an electronic apparatus using a liquid crystal device of the present invention according to another embodiment of the present invention.

DETAILED DESCRIPTION OF PREFERRED EMBODIMENTS

Embodiments of the present invention will be described with reference to the drawings. In a description of the embodiments, among various electrooptic devices, an active matrix liquid crystal device using a liquid crystal as an electrooptic material and TFD elements as active elements is described as an example. Also, the embodiments described below have a basic common construction, and thus the common construction is first described, and the construction characteristic of each of the embodiments is then described.

FIG. 2 is an exemplary block diagram schematically showing the electrical configuration of a liquid crystal device to which the present invention is applied. FIG. 3 is an exploded perspective view showing the structure of the liquid crystal device.

As shown in FIG. 2, a liquid crystal device 1 can include a plurality of scanning lines 51 extending in the line direction (X direction), a plurality of data lines 52 extending in the column direction (Y direction), and pixels 53 formed at positions respectively corresponding to the intersections of the scanning lines 51 and the data lines 52. The scanning lines 51 are driven by a scanning line driving circuit 57, and the data lines 52 are driven by a data line driving circuit 58. Each of the pixels 53 comprises a liquid crystal layer 54 and a pixel switching TFD element 56, which are connected in series.

As shown in FIG. 3, the liquid crystal device 1 can include a counter substrate 10 and an element substrate 20 which are bonded together with a sealing material (not shown in the drawing) provided therebetween, and a liquid crystal 6 sandwiched between both substrates. The counter substrate 10 and the element substrate 20 are light transmitting substrates. Of both substrates, the element substrate 20 has the plurality of scanning lines 51 formed on the surface thereof, pixel electrodes 66 being electrically connected to each of the scanning lines 51 through the TFD elements 56.

On the other hand, the counter substrate 10 has color filter layers 2R, 2G and 2B formed on the surface corresponding to the colors of red (R), green (G) and blue (B), respectively, and a planarizing layer (not shown in the drawing) formed to cover the color filters. Furthermore, the plurality of data lines 52 are formed on the planarizing layer so as to extend in the direction crossing the scanning lines 51. Each of the data lines 52 can include a stripe electrode made of a transparent conductive material such as ITO (Indium Tin Oxide), or the like. The data lines 52 are formed corresponding to the columns of the pixel electrodes 66 formed on the element substrate 20.

In the above-described construction, when a scanning signal is supplied to each of the scanning lines 51 formed on the surface of the element substrate 20, and a data signal can be supplied to each of the data lines 52 formed on the counter substrate 10, the orientation direction of the liquid crystal 6 can be changed in the portions held between the pixel electrodes 66 and the data lines 52. Therefore, light emitted from a backlight device 3 is transmitted through the element substrate 20 and the pixel electrodes 66, incident on the liquid crystal 6, and modulated by the liquid crystal for each of the pixels. The modulated light is transmitted through the data lines 52 and the counter substrate 10, and emitted to the observation side, as shown by arrow L. At this time, light is colored by the color filters 2R, 2G and 2B, thereby permitting a color display.

When an ordinary TN (Twisted Nematic) mode liquid crystal is used as the liquid crystal 6, polarizer plates 8 and 9 are respectively bonded to the outer surfaces of the element substrate 20 and the counter substrate 10 because in this type of liquid crystal 6, light is modulated by changing the polarization direction of light.

In the embodiment shown in FIGS. 2 and 3, the scanning lines 51 are formed on the element substrate 20, and the data lines 52 are formed on the counter substrate 10. However, conversely, the data lines may be formed on the element substrate 20, and the scanning lines may be formed on the counter substrate 10.

A description will now be made of the configuration of the components formed on the element substrate 20, which constitute each of the pixels 53, with reference to FIGS. 4(a) to (c). FIG. 4(a) is a plan view showing the construction on the element substrate 20 corresponding to one pixel, FIG. 4(b) is a sectional view taken along line III—III' in FIG. 4(a), and FIG. 4(c) is a perspective view showing the construction of the TFD element corresponding to each pixel.

As shown in FIGS. 4(a) to (c), an underlying layer 61 is formed on the surface of the element substrate 20. The underlying layer 61 includes, for example, a thin film having a thickness of 50 nm to 200 nm and made of tantalum oxide ($Ta_2O_5$). The TFD element 56 has a so-called back-to-back structure having two TFD element components including a first TFD element 56a and a second TFD element 56b formed on the underlying layer 1. Therefore, the TFD element 56 has the nonlinear current-voltage characteristics symmetrized in the positive and negative directions.

The first TFD element 56a and the second TFD element 56b comprise a first metal film 62, an insulating film 63 formed on the surface of the first metal film 62, and second metal films 64a and 64b formed to be spaced on the surface of the insulating film 63. The first metal film 62 is made of, for example, a Ta (tantalum) single material, or a Ta alloy such as a Ta-W (tungsten) alloy, or the like. On the other hand, the insulating film 63 having a film formed to a thickness of about 10 nm to 35 nm on the surface of the first metal film 62 by oxidizing Ta. Namely, the insulating film 63 is made of tantalum oxide ($Ta_2O_5$) or the like.

The second metal films 64a and 64b include a thin film formed to a thickness of about 50 nm to 300 nm by using a metal such as chromium (Cr) or the like. The second metal film 64a is a portion branched from the corresponding scanning line 51. On the other hand, the second metal film 64b is connected to the corresponding pixel electrode 66 made of a transparent conductive material such as ITO or the like. As shown in FIGS. 4(a) and (b), the regions of the underlying layer 61, in which the pixel electrodes 66 are formed, are removed.

The pixel electrodes 66 may be made of a light reflecting material, such as Al (Aluminum) or the like. In this case, light incident from the counter substrate 10 is reflected by the surfaces of the pixel electrodes 66, and emitted from the counter substrate 10, thereby realizing a so-called reflective display. When the pixel electrodes 66 are made of a reflecting material, in some cases, light transmitting slits are formed in the pixels, or the pixel electrodes 66 are thinned to impart both the light reflecting and transmitting properties. Alternatively, the pixel electrodes 66 are made of a transparent conductive material, and a light reflector plate made of a light reflecting material such as Al (aluminum) or the like is formed on the substrate having the pixel electrodes 66 formed thereon, or the counter substrate. In this case, light transmitting slits are formed in the light reflector plate, or the light reflector plate is thinned to impart both the light reflecting and transmitting properties.

A first embodiment of the present invention will be described with reference to FIGS. 5 to 7. FIGS. 5, 6 and 7 are respectively a drawing showing the steps of a method of manufacturing the element substrate 20 shown in FIG. 2, a sectional view showing the underlying layer forming step to the bridge removing step, and a sectional view showing the second metal film forming step to the pixel electrode forming step.

In the manufacture of the element substrate 20 of the liquid crystal device 1, as shown in FIG. 5, the underlying layer forming step (a), the first metal film forming step (b), the insulating film forming step (c), the high-pressure annealing step (c1), the bridge removing step (d), the second metal film forming step (e), the underlying layer removing step (f) and the pixel electrode forming step (g) are performed in this order. Each of these steps is described with reference to FIGS. 6 and 7. In manufacturing the element substrate 20 and the counter substrate 10, the components, such as the TFD elements 56 and the like, are formed in a large-scale original substrate from which as many single substrates of a size corresponding to each liquid crystal device 1 as possible can be obtained. However, in the description below, the single substrate is referred to as "the element substrate 20" or "the counter substrate 10" without being discriminated from the original substrate.

In FIG. 6, in underlying layer forming step (a), a Ta oxide, for example, $Ta_2O_5$, is first uniformly deposited to a thickness of, for example, about 50 nm to 200 nm, on the surface of the element substrate 20 to form the underlying layer 61.

Next, in the first metal film forming step (b), for example, Ta is uniformly deposited to a thickness of, for example, about 100 nm to 500 nm by sputtering or the like, and the first layers of the scanning lines 51 and the first metal films 62 are simultaneously formed by photolithography. In this step, the first layers of the scanning lines 51 are connected to the first metal films 62 through bridge portions 69.

Next, in the insulating film forming step (c), anodization is effected by using the first layers of the scanning lines 51 as anodes to form anodic oxide films having a uniform thickness of, for example, 10 nm to 35 nm, and functioning as the insulating films 63 on the surfaces of the scanning lines 51 and the first metal films 52. In this step, the insulating films (second layers) are formed on the surfaces of the scanning lines 51, and the insulating layers 63 are formed for the first TFD elements 56a and the second TFD elements 56b.

In this embodiment, next, the insulating films 63 are annealed (c1) under high pressure in a predetermined atmosphere. The high-pressure annealing (c1) is performed in an inert gas atmosphere, a nitrogen gas atmosphere or an atmosphere containing water vapor at a temperature of 100° C. to 600° C., preferably 150° C. to 300° C., and a pressure of 0.5 MPa to 3 MPa, preferably 0.5 MPa to 2 MPa, for 30 minutes to 2 hours.

Next, in the bridge removing step (d), the bridge portions 59 are removed from the element substrate 20 by a photolithography process. In this step, the first metal films 62 and the insulating films 63 of the first TFD elements 56a and the second TFD element 56b are respectively formed as islands separated from the scanning lines 51.

Next, in the second metal film forming step (e) shown in FIG. 7, Cr is deposited to a uniform thickness, for example, of about 50 nm to 300 nm, by sputtering or the like, and the third layers of the scanning lines 51, the second metal films 64a of the first TFD elements 56a and the second metal films 64b of the second TFD elements 56b are then formed by the photolithography process. As a result, the TFD elements 56 serving as active elements are formed.

It should be understood that the order of the bridge removing step (d) and the second metal film forming step (e) may be reversed.

Next, in the underlying layer removing step (f), the regions of the underlying layer 61 in which the pixel electrodes 66 are formed are removed, and in the pixel electrode forming step (g), ITO for forming the pixel electrodes 66 is deposited to a uniform thickness by sputtering or the like, and the pixel electrodes 66 each having a predetermined shape corresponding to the size of one pixel are formed by the photolithography process so as to partially overlap the second metal films 64b. By the series of the steps, the TFD elements 56 and the pixel electrodes 66 shown in FIGS. 3 and 4 are formed.

It should be understood that the underlying layer removing step (f) and the bridge removing step (d) may be simultaneously performed.

Although not shown in the drawings, polyimide, polyvinyl alcohol, or the like is then formed to a uniform thickness on the surface of the element substrate 20 to form an alignment film, and then the alignment film is subjected to orientation treatment such as rubbing or the like.

On the other hand, in order to manufacture the counter substrate 10 shown in FIG. 3, the color filters 2R, 2G and 2B are formed, and then the planarizing layer (not shown in the drawing) is formed on the color filters 2R, 2G and 2B. Then, the stripe-shaped counter electrodes, i.e., the data lines 52, are formed by ITO films. Next, an alignment film (not shown in the drawing) of polyimide or the like is formed to a uniform thickness on the data lines 52, and then the alignment film is subjected to orientation treatment such as rubbing or the like. As a result, the counter substrate 20 is completed.

Then, the element substrate 20 and the counter substrate 10 are aligned with each other, and bonded together with a sealing material (not shown in the drawing) provided therebetween. Then, the liquid crystal 6 is injected into the gap between both substrates under reduced pressure, and a sealant such as a resin or the like is coated on a liquid crystal injection port (not shown in the drawing) to complete the liquid crystal device 1.

In this embodiment, in forming the element substrate 20, the insulating films 63 formed by anodization are annealed under a high pressure in an inert gas atmosphere, a nitrogen atmosphere or an atmosphere containing water vapor to modify the insulating films 63 formed by anodization. Therefore, the nonlinearity of the current-voltage characteristics of the TFD elements 56 can be improved to make it possible to set the driving voltage of the liquid crystal device 1 to a low value and perform a high-quality display, as compared with annealing under a normal pressure in a water vapor atmosphere.

Annealing under a high pressure can produce the same effect as conventional annealing at a lower temperature than conventional annealing, thereby preventing deformation of the element substrate 20.

Although, in this embodiment, the second metal films 64a and 64b are made of Cr, it should be understood that the material of the second metal films is not limited to this, and other metals such as Ti, Mo, Al and the like can also be used.

Although, in this embodiment, each of the TFD elements 56 has the back-to-back structure including the two TFD elements including the first TFD element 56a and the second TFD element 56b, it should be understood that the TFD element is not limited to this, and the TFD element 56 may have a structure comprising only one TFD element. In this case, in the first metal film forming step (b), the first metal film 62 is formed in the shape of wiring to form the scanning lines 51, and in the second metal film forming step (e), only the second metal films 64b are formed. Also, the bridge removing step (d) is not required.

In the first embodiment, the insulating films 63 are formed on the surfaces of the first metal films 62 by anodization, and then modified by high-pressure annealing. However, in this embodiment, high-pressure annealing is performed as pretreatment of the first metal films 62 before the insulating films 63 are formed by anodization, as described with reference to FIGS. 8 and 9.

FIG. 8 is a drawing showing the steps of the method of manufacturing the element substrate in the process for manufacturing a liquid crystal device of a second embodiment of the present invention, and FIG. 9 is a sectional view showing the steps from the underlying layer forming step to the insulating film forming step of the manufacturing steps shown in FIG. 8. In this embodiment, and in each of the embodiments described below, the structures of a liquid crystal device, an element substrate and TFD elements are the same as the first embodiment, and thus a description of common portions is omitted. The manufacturing steps are also described with reference to FIG. 7.

In this embodiment, in manufacturing the element substrate 20 of the liquid crystal device, the underlying layer forming step (a), the first metal film forming step (b), high-pressure annealing (c2), the insulating film forming step (c), the bridge removing step (d), the second metal film forming step (e), the underlying layer removing step (f), and the pixel electrode forming step (g) are performed in this order, as shown in FIG. 8.

Namely, like in the first embodiment, in this embodiment, in the underlying layer forming step (a) shown in FIG. 9, a Ta oxide, for example, $Ta_2O_5$, is deposited to a uniform thickness on the surface of the element substrate 20 to form an underlying film 61, and in the first metal film forming step (b), for example, Ta is deposited to a uniform thickness of, for example, about 100 nm to 500 nm, by sputtering or the like. Furthermore, the first layers of the scanning lines 51 and the first metal films 62 are simultaneously formed by the photolithography process.

Next, in this embodiment, the first layers of the scanning lines 51 and the first metal films 62 are annealed (c2) under high pressure in a predetermined atmosphere. The high-pressure annealing (c2) is performed in an atmosphere containing water vapor at a temperature of 100° C. to 600° C. and a pressure of 0.5 MPa to 3 MPa for 30 minutes to 2 hours. As a result, the surfaces of the first layers of the scanning lines and the first metal films 62 are oxidized to form thin insulating films 63'.

Next, in the insulating film forming step (c), anodization is effected by using the first layers of the scanning lines 51 as anodes to form anodic oxide films having a uniform thickness of, for example, 10 nm to 35 nm, and functioning as the insulating films 63 on the surfaces of the scanning lines 51 and the first metal films 52. In this step, the insulating films (second layers) are formed on the surfaces of the scanning lines 51, and the insulating layers 63 are formed for the first TFD elements 56a and the second TFD elements 56b.

Next, in the bridge removing step (d), the bridge portions 69 are removed from the element substrate 20 by the photolithography process. In this step, the first metal films 62 and the insulating films 63 of the first TFD elements 56a and the second TFD element 56b are respectively formed as islands separated from the scanning lines 51.

Next, the second metal film forming step (e) is performed by the same method as the first embodiment described above with reference to FIG. 7 to deposit Cr to a uniform thickness by sputtering or the like, and third layers of the scanning lines 51, the second metal films 64a of the first TFD elements 56a and the second metal films 64b of the second TFD elements 56b are then formed by the photolithography process. As a result, the TFD elements 56 serving as active elements are formed. Also, like in the first embodiment, in the underlying layer removing step (f), the regions of the underlying layer 61 in which the pixel electrodes 66 are formed are removed, and in the pixel electrode forming step (g), the pixel electrodes 66 are formed. The underlying layer removing step (f) and the bridge removing step (d) may be simultaneously performed.

In this embodiment, the insulating films 63' formed by high-pressure annealing (c2) and the insulating films 63 formed by anodization are used as the insulating films of the TFD elements 56. Therefore, the nonlinearity of the current-voltage characteristics of the TFD elements 56 can be improved. This embodiment thus exhibits the effect of making it possible to set the driving voltage of the liquid crystal device 1 to a low value and perform a high-quality display.

Although, in this embodiment, the second metal films 64a and 64b are made of Cr, it should be understood that the material of the second metal films is not limited to this, and other metals such as Ti, Mo, Al and the like can also be used.

Although, in this embodiment, each of the TFD elements 56 has the back-to-back structure including the two TDD elements including the first TFD element 56a and the second TFD element 56b, it should be understood that the TFD element is not limited to this, and the TFD element 56 may have a structure having only one TFD element. In this case, in the first metal film forming step (b), the first metal films 62 are formed in the shape of wiring to form the scanning lines 51, and in the second metal film forming step (e), only the second metal films 64b are formed. Also, the bridge removing step (d) is not required.

In the first and second embodiments, high-pressure annealing (c1) or (c2) is effected for modifying the insulating films 63 formed by anodizing the surfaces of the first metal films 62, or as pre-treatment before the insulating films 63 are formed by anodization. However, in a third embodiment, high-pressure annealing is effected as the insulating film forming step (c), and thus anodization is omitted, as described below with reference to FIGS. 10 and 11.

FIG. 10 is a drawing showing the steps of the method of manufacturing the element substrate in the process for manufacturing a liquid crystal device of the third embodiment of the present invention, and FIG. 11 is a sectional view showing the steps from the underlying layer forming step to the insulating film forming step of the manufacturing steps shown in FIG. 10.

In this embodiment, in manufacturing the element substrate of the liquid crystal device, the underlying layer forming step (a), the first metal film forming step (b), high-pressure annealing as the insulating film forming step (c), the second metal film forming step (e), the underlying layer removing step (f), and the pixel electrode forming step (g) are performed in this order, as shown in FIG. 10. In this embodiment, anodization is not effected in the insulating film forming step (c) to make unnecessary the bridge portions for power feeding for anodization. Therefore, the bridge removing step of the first and second embodiments are not performed.

Namely, in this embodiment, in the underlying layer forming step (a) shown in FIG. 11, a Ta oxide, for example, $Ta_2O_5$, is deposited to a uniform thickness on the surface of the element substrate 20 to form an underlying film 61, and in the first metal film forming step (b), for example, Ta is deposited to a uniform thickness of, for example, about 100 nm to 500 nm, by sputtering or the like. Furthermore, the first metal films 62 are formed by the photolithography process. In the first metal film forming step (b), the first metal films 62 of the first TFD elements 56a and the second TFD elements 56b are respectively formed as separated islands of the TFD elements.

Next, in this embodiment, in the insulating film forming step (c), the first metal films 62 are annealed at a high temperature and high pressure in an atmosphere containing water vapor. The high-pressure annealing is performed at a temperature of 250° C. to 600° C. and a pressure of 0.5 MPa to 3 MPa, preferably at a temperature of 300° C. to 400° C. and a pressure of 0.5 MPa to 2 MPa, for 30 minutes to 2 hours. As a result, the insulating films 63 of the first TFD elements 56a and the second TFD elements 56b are formed to a uniform thickness of, for example 10 nm to 35 nm, on the surfaces of the first metal films 52.

In this step, the first metal films 62 and the insulating films 63 of the first TFD elements 56a and the second TFD element 56b are respectively formed as separated islands of the TFD elements. Therefore, the bridge removing step described above in the first and second embodiments are unnecessary.

Therefore, in this embodiment, after the insulating film forming step (c), the second metal film forming step (e) is performed by the same method as the embodiment 1 described above with reference to FIG. 7 to deposit Cr to a uniform thickness by sputtering or the like, and the scanning lines 51, the second metal films 64a of the first TFD elements 56a and the second metal films 64b of the second TFD elements 56b are then formed by the photolithography process. As a result, the TFD elements 56 serving as active elements are formed. Also, like in the first and second embodiments, in the underlying layer removing step (f), the regions of the underlying layer 61 in which the pixel electrodes 66 are intended to be formed are removed, and in the pixel electrode forming step (g), the pixel electrodes 66 are formed. The underlying layer removing step (f) and the first metal film forming step (b) or the second metal film forming step (e) may be simultaneously performed.

In this embodiment, the insulating films 63 are formed by high-pressure annealing in the insulating film forming step (c), and thus nonlinearity of the current-voltage characteristics of the TFD elements 56 can be improved. Therefore, this embodiment exhibits the effect of making it possible to set the driving voltage of the liquid crystal device 1 to a low value and perform a high-quality display.

Furthermore, in this embodiment, the insulating films 63 are formed by high-pressure annealing in the insulating film forming step (c), and thus anodization is not effected. Therefore, unlike in the first and second embodiments, the bridge portions (refer to FIG. 6) need not be formed for power feeding for anodization, and thus the step of removing the bridge portions can be omitted.

Although, in this embodiment, each of the TFD elements 56 has the back-to-back structure having the two TFD elements including the first TFD element 56a and the second TFD element 56b, it should be understood that the TFD element is not limited to this, and the TFD element 56 may have a structure comprising only one TFD element. In this case, in the first metal film forming step (b), the first metal films 62 are formed in the shape of wiring to form the scanning lines 51, and in the second metal film forming step (e), only the second metal films 64b are formed.

FIG. 12 is a drawing showing the steps of the method of manufacturing an element substrate in the process for manufacturing a liquid crystal device of a fourth embodiment of the present invention, and FIG. 13 is a sectional view showing the steps from the underlying layer forming step to the normal-pressure re-annealing step of the manufacturing steps shown in FIG. 12.

In this embodiment, in manufacturing the element substrate of the liquid crystal device, the underlying layer forming step (a), the first metal film forming step (b), high-pressure annealing and normal-pressure re-annealing (c3) as the insulating film forming step (c), the second metal film forming step (e), the underlying layer removing step (f), and the pixel electrode forming step (g) are performed in this order, as shown in FIG. 12. In this embodiment, anodization is not effected in the insulating film forming step (c) to make unnecessary the bridge portions for power feeding for anodization. Therefore, the bridge removing step of the first and second embodiments is not performed.

In this embodiment, in the underlying layer forming step (a) shown in FIG. 13, a Ta oxide, for example, $Ta_2O_5$, is deposited to a uniform thickness on the surface of the element substrate 20 to form an underlying film 61, and in the first metal film forming step (b), for example, Ta is deposited to a uniform thickness of, for example, about 100 nm to 500 nm, by sputtering or the like. Furthermore, the first metal films 62 are formed by the photolithography process. In the first metal film forming step (b), the first metal films 62 of the first TFD elements 56a and the second TFD elements 56b are respectively formed as separated islands of the TFD elements.

Next, in the insulating film forming step (c), the first metal films 62 are annealed under high pressure in an atmosphere containing water vapor, i.e., under a high temperature and high pressure condition.

Specifically, the high-pressure annealing of the first metal films 62 can be performed at a temperature of 250° C. to 600° C. and a pressure of 0.5 MPa to 3 MPa, preferably at a temperature of 300° C. to 400° C. and a pressure of 0.5 MPa to 2 MPa, for 30 minutes to 2 hours. As a result, the insulating films 63 of the first TFD elements 56a and the second TFD elements 56b are formed to a uniform thickness of, for example 10 nm to 35 nm, on the surfaces of the first metal films 62. In this step, the first metal films 62 and the insulating films 63 of the first TFD elements 56a and the second TFD elements 56b are respectively formed as separated islands. Therefore, the bridge removing step in the above-described manufacturing method including anodization is unnecessary.

Next, re-annealing (c3) of the insulating layers 63 is preformed under normal pressure in an atmosphere containing nitrogen or water vapor. The re-annealing is effected, for example, under the condition of 100° C. to 500° C. As a result, the insulating films 63 formed in the insulating film forming step (c) have improved crystallinity.

In this way, after re-annealing (c3) under normal pressure, the second metal film forming step (e) is performed by the same method as described above with reference to FIG. 7 to deposit Cr to a uniform thickness by sputtering or the like, and the scanning lines 51, the second metal films 64a of the first TFD elements 56a and the second metal films 64b of the second TFD elements 56b are then formed by the photolithography process. As a result, the TFD elements 56 serving as active elements are formed. Also, like in the first and second embodiments, in the underlying layer removing step (f), the regions of the underlying layer 61 in which the pixel electrodes 66 are intended to be formed are removed, and in the pixel electrode forming step (g), the pixel electrodes 66 are formed. The underlying layer removing step (f) and the first metal film forming step (b) or the second metal film forming step (e) may be simultaneously performed.

In the manufacturing method of this embodiment, the insulating films 63 are formed by high-pressure annealing and re-annealed (c3) at normal pressure to improve crystallinity in the insulating film forming step (c), and thus nonlinearity of the current-voltage characteristics of the TFD elements 56 can be improved. Therefore, this embodiment exhibits the effect of making it possible to set the driving voltage of the liquid crystal device 1 to a low value and perform a high-quality display.

Furthermore, in the method of this embodiment, the insulating films 63 are formed by high-pressure annealing in the insulating film forming step (c), and thus anodization is unnecessary. Therefore, unlike in the above-described manufacturing method including anodization, the bridge portions 69 (refer to FIG. 6) need not be formed for power feeding for anodization, and thus the step of removing the bridge portions 69 can be omitted.

Although, in this embodiment, each of the TFD elements 56 has the back-to-back structure comprising the two TDD elements including the first TFD element 56a and the second TFD element 56b, it should be understood that the TFD element is not limited to this, and the TFD element 56 may have a structure having only one TFD element. In this case, in the first metal film forming step (b), the first metal films 62 and third metal films 62' are formed in the shape of wiring to form the scanning lines 51, and in the second metal film forming step (e), only the second metal films 64b are formed. Although, in this embodiment, the second metal films 64a and 64b are made of Cr, it should be understood that the material of the second metal films is not limited to this, and other metals such as Ti, Mo, Al and the like can also be used.

In the third embodiment, the surfaces of the first metal films 62 are annealed under high pressure to form the insulating films 63. However, another metal film formed on the surface of each of the first metal films 62 may be oxidized by high-pressure annealing, and used as an insulating film of each of the TFD elements 56, as described with reference to FIGS. 14 and 15.

FIG. 14 is a drawing showing the steps of the method of manufacturing an element substrate in the process for manufacturing a liquid crystal device of a fifth embodiment of the present invention, and FIG. 15 is a sectional view showing the steps from the underlying layer forming step to the insulating film forming step of the manufacturing steps shown in FIG. 14.

In this embodiment, in manufacturing the element substrate 20 of the liquid crystal device, the underlying layer forming step (a), the first metal film forming step (b), the third metal film forming step (b'), high-pressure annealing as the insulating film forming step (c), the second metal film forming step (e), the underlying layer removing step (f), and the pixel electrode forming step (g) are performed in this order, as shown in FIG. 14. In this embodiment, anodization is not effected in the insulating film forming step (c) to make unnecessary bridge portions for power feeding for anodization. Therefore, the bridge removing step of the first and second embodiments is not performed.

In this embodiment, in the underlying layer forming step (a) shown in FIG. 15, a Ta oxide, for example, $Ta_2O_5$, is deposited to a uniform thickness on the surface of the element substrate 20 to form an underlying film 61, and in the first metal film forming step (b), for example, Ta is deposited to a uniform thickness of, for example, about 100 nm to 500 nm, by sputtering or the like. Furthermore, the first metal films 62 are formed by the photolithography process. In the first metal film forming step, the first metal films 62 of the first TFD elements 56a and the second TFD elements 56b are respectively formed as separated islands.

Next, in the third metal film forming step (b'), for example, Ta is deposited to a uniform thickness by sputtering or the like, and third metal films 62' are formed by the photolithography process so as to overlap the first metal films 62.

The first metal films 62 and the third metal films 62' may be formed by simultaneously patterning a metal film for the first metal films 62 and a metal film for the third metal films 62' after both films are laminated. In any procedure, anodization is not effected in this embodiment, and thus the first metal films 62 and the third metal films 62' are respectively formed as separated islands.

Next, in the insulating film forming step (c), the third metal films 62' are annealed under high pressure in an atmosphere containing water vapor, i.e., under a high temperature and high pressure condition. Specifically, the high-pressure annealing is performed at a temperature of 250° C. to 600° C. and a pressure of 0.5 MPa to 3 MPa, preferably at a temperature of 350° C. to 400° C. and a pressure of 0.5 MPa to 2 MPa, for 30 minutes to 2 hours. As a result, the surface of the third metal films or all the third metal films 62' are oxidized to form the insulating films 63 having a uniform thickness of, for example 10 nm to 35 nm.

In this step, the first metal films 62 and the insulating films 63 of the first TFD elements 56a and the second TFD elements 56b are respectively formed as separated islands. Therefore, the bridge removing step in the first and second embodiments is unnecessary.

Therefore, in this embodiment, after the insulating film forming step (c), the second metal film forming step (e) is performed by the same method as described above with reference to FIG. 7 to deposit Cr to a uniform thickness by sputtering or the like, and the scanning lines 51, the second metal films 64a of the first TFD elements 56a and the second metal films 64b of the second TFD elements 56b are then formed by the photolithography process. As a result, the TFD elements 56 serving as active elements are formed. Also, like in the first and second embodiments, in the underlying layer removing step (f), the regions of the underlying layer 61 in which the pixel electrodes 66 are intended to be formed are removed, and in the pixel electrode forming step (g), the pixel electrodes 66 are formed. The underlying layer removing step (f) and the first metal film forming step (b) or the second metal film forming step (e) may be simultaneously performed.

In this embodiment, the insulating films 63 are formed by high-pressure annealing in the insulating film forming step (c), and thus nonlinearity of the current-voltage characteristics of the TFD elements 56 can be improved. Therefore, this embodiment exhibits the effect of making it possible to set the driving voltage of the liquid crystal device 1 to a low value and perform a high-quality display.

Furthermore, in this embodiment, the insulating films 63 are formed by high-pressure annealing in the insulating film forming step (c), and thus anodization is not effected. Therefore, unlike in the first and second embodiments, the bridge portions 69 (refer to FIG. 6) need not be formed for power feeding for anodization, and thus the step of removing the bridge portions 69 can be omitted.

Although, in this embodiment, the second metal films 64a and 64b are made of Cr, it should be understood that the material of the second metal films is not limited to this, and other metals such as Ti, Mo, Al and the like can also be used.

Although, in this embodiment, each of the TFD elements 56 has the back-to-back structure including the two TFD elements including the first TFD element 56a and the second TFD element 56b, it should be understood that the TFD element is not limited to this, and the TFD element 56 may have a structure having only one TFD element. In this case, in the first metal film forming step (b), the first metal films 62 and the third metal films 62' are formed in the shape of wiring to form the scanning lines 51, and in the second metal film forming step (e), only the second metal films 64b are formed.

Since the insulating films 63 are formed by oxidizing the third metal films 62', the first metal films 62 do not necessarily comprise Ta films, and other metal films, such as Cr films or the like, may be used.

FIG. 16 is a drawing showing the steps of the method of manufacturing an element substrate in the process for manufacturing a liquid crystal device of embodiment 6 of the present invention, and FIG. 17 is a sectional view showing the steps from the underlying layer forming step to the insulating film forming step of the manufacturing steps shown in FIG. 16.

In a similar manner to the fifth embodiment, in this embodiment, another metal film is formed on the surface of each of the first metal films 62, oxidized by high-pressure annealing, and used as an insulating film 63 of each of the TFD elements 56. Namely, in this embodiment, in manufacturing the element substrate 20 of the liquid crystal device, the underlying layer forming step (a), the first metal film forming step (b), the third metal film forming step (b'), high-pressure annealing as the insulating film forming step (c), normal-pressure re-annealing (c3), the second metal film forming step (e), the underlying layer removing step (f), and the pixel electrode forming step (g) are performed in this order, as shown in FIG. 16. In this embodiment, anodization is not effected in the insulating film forming step (c) to make unnecessary bridge portions for power feeding for anodization. Therefore, the bridge removing step of the first and second embodiments is not performed.

In this embodiment, in the underlying layer forming step (a) shown in FIG. 17, a Ta oxide, for example, $Ta_2O_5$, is deposited to a uniform thickness on the surface of the element substrate 20 to form an underlying film 61. In the first metal film forming step (b), for example, a metal film of Ta is deposited to a uniform thickness of, for example, about 100 nm to 500 nm, by sputtering or the like, and then patterned by the photolithography process to form the first metal films 62. Unlike in the manufacturing method including anodization, in the first metal film forming step, the first metal films 62 of the first TFD elements 56a and the second TFD elements 56b are respectively formed as separated islands.

Next, in the third metal film forming step (b'), an alloy containing at least Ta is deposited to a uniform thickness by sputtering or the like, and then patterned by the photolithography process to from the third metal films 62' so that the third metal films 62' are overlapped with the first metal films 62. Although, in this embodiment, the first metal films 62 and the third metal films 62' are formed by patterning after the respective forming steps, the first metal films 62 and the third metal films 62' may be formed by simultaneously patterning a metal film for the first metal films 62 and a metal film for the third metal films 62' after both films are laminated. In any procedure, the first metal films 62 and the third metal films 62' are respectively formed as separated islands.

Next, in the insulating film forming step (c), the third metal films 62' are annealed under high pressure in an atmosphere containing water vapor, i.e., under a high temperature and high pressure condition. Specifically, the high-pressure annealing of the third metal films 62' is performed at a temperature of 250° C. to 600° C. and a pressure of 0.5 MPa to 3 MPa, preferably at a temperature of 350° C. to 400° C. and a pressure of 0.5 MPa to 2 MPa, for 30 minutes to 2 hours. As a result, the surface of the third metal films or all the third metal films 62' are oxidized to form the insulating films 63 having a uniform thickness of, for example 10 nm to 35 nm. In this step, the first metal films 62 and the insulating films 63 of the first TFD elements 56a and the second TFD elements 56b are respectively formed as separated islands. Therefore, the bridge removing step in the manufacturing method comprising anodization is unnecessary.

Next, re-annealing (c3) of the insulating layers 63 is preformed under normal pressure in an atmosphere containing nitrogen or water vapor. The re-annealing is effected, for example, under the condition of 100° C. to 500° C. As a result, the insulating films 63 formed by high-pressure annealing have improved crystallinity.

Then, in this embodiment, after normal-pressure re-annealing (c3), the second metal film forming step (e) is performed by the same method as described above with reference to FIG. 7 to deposit Cr to a uniform thickness by sputtering or the like, and the scanning lines 51, the second metal films 64a of the first TFD elements 56a and the second metal films 64b of the second TFD elements 56b are then formed by the photolithography process. As a result, the TFD elements 56 serving as active elements are formed. Then, like in the first and second embodiments, in the underlying layer removing step (f), the regions of the underlying layer 61 in which the pixel electrodes 66 are intended to be formed are removed, and in the pixel electrode forming step (g), the pixel electrodes 66 are formed. The underlying layer removing step (f) and the first metal film forming step (b) or the second metal film forming step (e) may be simultaneously performed.

In the manufacturing method of this embodiment, in the insulating film forming step (c), the insulating films 63 are formed by high-pressure annealing of the third metal films 62', and crystallinity of the insulating films 63 is improved by re-annealing under normal pressure, thereby improving the nonlinearity of the current-voltage characteristics of the TFD elements 56. Therefore, this embodiment exhibits the effect of making it possible to set the driving voltage of the liquid crystal device 1 to a low value and perform a high-quality display.

Furthermore, in the method of this embodiment, the insulating films 63 are formed by high-pressure annealing of the third metal films 62' in the insulating film forming step (c), and thus anodization is unnecessary. Therefore, unlike in the manufacturing method including anodization, the bridge portions 69 (refer to FIG. 6) need not be formed for power feeding for anodization, and thus the step of removing the bridge portions 69 in not required. Consequently, the components of the element substrate 20 including the TFD elements 56 can be effectively formed only by the semiconductor process comprising a deposition step, an annealing step, a patterning step, etc.

Although, in this embodiment, the second metal films 64a and 64b are made of Cr, the material of the second metal films is not limited to this, and other metals, such as Ti, Mo, Al and the like, can also be used.

Although, in this embodiment, each of the TFD elements 56 has the back-to-back structure having the two TFD elements including the first TFD element 56a and the second TFD element 56b, it should be understood that the TFD element is not limited to this, and the TFD element 56 may have a structure comprising only one TFD element. In this case, in the first metal film forming step (b), the first metal films 62 and the third metal films 62' are formed in the shape of wiring to form the scanning lines 51, and in the second metal film forming step (e), only the second metal films 64b are formed.

Since the insulating films 63 are formed by oxidizing the third metal films 62', the first metal films 62 do not necessarily comprise Ta films, and other metal films such as Cr films or the like may be used.

Although, in each of the above embodiments, the TFD elements 56 having a $Ta/Ta_2O_5/Cr$ structure are formed by using Ta or a Ta alloy, and a Cr film, it should be understood that other metals, such as Nb, Al, Ti and the like, can also be used as long as the insulating films 63 can be formed by high-pressure annealing.

Although, in the above embodiments, the present invention is applied to a liquid crystal device using a liquid crystal as an electrooptic material, the present invention can also be applied to other various electronic apparatuses such as an EL display panel using an EL element as an electrooptic material, a plasma display panel using a gas as an electrooptic material, and the like. Therefore, the present invention can be applied to any apparatus having a nonlinear thin film diode including a first metal film, an insulating film and a second metal film regardless of the configuration of other components.

FIG. 18 shows an electronic apparatus using a liquid crystal device of the present invention as a display device according to an embodiment of the present invention. The electronic apparatus shown in the drawing includes a display information output source 70, a display information processing circuit 71, a power supply circuit 72, a timing generator 73, and a liquid crystal device 74. The liquid crystal device 74 includes a liquid crystal display panel and a driving circuit 76. For the liquid crystal display panel 75 of the liquid crystal device 74, the above-described liquid crystal device 1 can be used.

The display information output source 70 comprises memory such as ROM (Read Only Memory), RAM (Random Access memory), or the like, a storage unit comprising various disks, a tuning circuit for tuning and outputting digital picture signals, etc., for supplying display information such as an image signal in a predetermined format, and the like to the display information processing circuit 71 based on various clock signals produced by the timing generator 73.

The display information processing circuit 71 includes various known circuits, such as a serial-parallel conversion circuit, an amplifier-inverter circuit, a rotation, a gamma correction circuit, a clamp circuit, etc., for exerting processing of input display information to supply the picture signal to the driving circuit 76 together with the clock signal CLK. The driving circuit 76 is a general name for the scanning line driving circuit 57 and the data line driving circuit 58 shown in FIG. 2, an inspecting circuit, and the like. The power supply circuit 72 supplies a predetermined voltage to each of the components.

FIG. 19 shows a mobile personal computer as an electronic apparatus according to another embodiment of the present invention. The personal computer shown in the drawing can include a main body 82 having a keyboard 81, and a liquid crystal unit 83. The liquid crystal unit 83 includes the above-described liquid crystal device 1.

FIG. 20 shows a cellular phone as an electronic apparatus according to a further embodiment of the present invention. The cellular phone 90 shown in the drawing including a plurality operating buttons 91 and the liquid crystal device 1.

As described above, in the present invention, an insulating film formed by anodization is modified by high-pressure annealing in an inert gas atmosphere, a nitrogen gas atmosphere, or an atmosphere containing water vapor, and the surface of a metal film is oxidized by high-pressure annealing in an atmosphere containing water vapor. High-pressure annealing in a predetermined atmosphere can further improve nonlinearity of the current-voltage characteristics of a nonlinear element, as compared with annealing under normal pressure in a water vapor atmosphere. Therefore, the present invention exhibits the effect of making it possible to set the driving voltage of a liquid crystal device to a lower value, and perform a display of high quality.

When an insulating film of a nonlinear element includes only an insulating film formed by high-pressure annealing, even in manufacturing a TFD element having a back-to-back structure, bridge portions for power feeding are not required for connecting a plurality of first metal films, and thus the step of removing the bridge portions can be omitted to permit an attempt to simplify the manufacturing process.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. A method of manufacturing a nonlinear element having a first metal film, an insulating film, and a second metal film, the method comprising:

forming a first metal film;

performing high-pressure annealing of the first metal film in a predetermined atmosphere under a high pressure, the high-pressure annealing step being performed under a pressure of 0.5 MP to 3 MPa; and forming a second metal film.

2. The method of manufacturing a nonlinear element according to claim 1, the first metal film comprising a metal film including at least Ta.

3. The method of manufacturing a nonlinear element according to claim 1, further comprising:

forming an insulating film by anodizing a surface of the first metal film after forming the first metal film;

performing high-pressure re-annealing in at least one of an inert gas atmosphere, a nitrogen gas atmosphere, and an atmosphere containing water vapor; and forming the second metal film on a surface of the insulating film.

4. A method of manufacturing an electrooptic device having a substrate holding an electrooptic material, the method comprising:

forming a nonlinear element as a pixel switching element on a surface of the substrate on which the electrooptic material is held, by the method of manufacturing a nonlinear element according to claim 1, and forming a pixel electrode on the substrate so that the pixel electrode is connected to the nonlinear element.

5. The method of manufacturing an electrooptic device according to claim 4, the electrooptic material being a liquid crystal.

6. A method of manufacturing an electrooptic device having a substrate holding an electrooptic material, the method comprising:

forming a nonlinear element as a pixel switching element on a surface of the substrate on which the electrooptic material is held, by the method of manufacturing a nonlinear element according to claim 1.

7. A method of manufacturing a nonlinear element having a first metal film, an insulating film, and a second metal film, the method comprising:

forming a first metal film;

performing high-pressure annealing of the first metal film in an atmosphere containing water vapor to oxidize a surface of the first metal film;

forming an insulating film by anodizing a surface of the first metal film; and forming the second metal film on a surface of the insulating film.

8. A method of manufacturing a nonlinear element having a first metal film, an insulating film, and a second metal film, the method comprising:

forming a first metal film;

performing high-pressure annealing of the first metal film in a predetermined atmosphere under a high pressure; and forming a second metal film, the high pressure annealing step being performed under a pressure of 0.5 MPa to 2 MPa.

9. A method of manufacturing a nonlinear element having a first metal film, an insulating film, and a second metal film, the method comprising:

forming a first metal film;

oxidizing a surface of the first metal film by high-pressure annealing in an atmosphere containing water vapor to form an insulating film; and forming the second metal film on a surface of the insulating film.

10. The method of manufacturing a nonlinear element according to claim 9, further comprising re-annealing the insulating film under a lower pressure than the high-pressure annealing step after the high-pressure annealing step.

11. The method of manufacturing a nonlinear element according to claim 10, the second metal film being formed on a surface of the insulating film in the second metal film forming step after the re-annealing step.

12. The method of manufacturing a nonlinear element according to claim 9, the high-pressure annealing step being performed under the conditions including a temperature of 250° C. to 400° C., and a pressure of 0.5 MPa to 3 MPa.

13. The method of manufacturing a nonlinear element according to claim 12, the high-pressure annealing step being performed under the conditions including a temperature of 300° C. to 400° C., and a pressure of 0.5 MPa to 2 MPa.

14. A method of manufacturing a nonlinear element having a first metal film, an insulating film, and a second metal film, the method comprising:

forming a first metal film;

forming a third metal film on a surface of the first metal film after the first metal film forming step;

oxidizing a surface of the third metal film by high-pressure annealing in an atmosphere containing water vapor to form an insulating film after the third metal film forming step; and forming the second metal film on a surface of the insulating film.

15. The method of manufacturing a nonlinear element according to claim 14, the third metal film comprising a metal film including at least Ta.

16. The method of manufacturing a nonlinear element according to claim 14, further comprising re-annealing the insulating film under a lower pressure than the high-pressure annealing step after the high-pressure annealing step.

17. The method of manufacturing a nonlinear element according to claim 16, the re-annealing step being performed by an atmosphere containing at least one of water vapor and nitrogen to crystallize the insulating film.

18. The method of manufacturing a nonlinear element according to claim 16, the re-annealing step being performed under the condition of a temperature of 100° C. to 500° C.

19. A method of manufacturing a nonlinear element having a first metal film, an insulating film, and a second metal film, the method comprising:

forming a first metal film;

performing high-pressure annealing of the first metal film in a predetermined atmosphere under a high pressure; and performing re-annealing under a lower pressure than that in the high-pressure annealing.

* * * * *